US012648341B2

(12) United States Patent
Lee et al.

(10) Patent No.: US 12,648,341 B2
(45) Date of Patent: Jun. 2, 2026

(54) DISPLAY APPARATUS AND METHOD OF MANUFACTURING THE SAME

(71) Applicant: Samsung Display Co., Ltd., Yongin-si (KR)

(72) Inventors: Seon Uk Lee, Seongnam-si (KR);
Kanguk Kim, Hwaseong-si (KR);
Donchan Cho, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 669 days.

(21) Appl. No.: 18/063,566

(22) Filed: Dec. 8, 2022

(65) Prior Publication Data

US 2023/0263008 A1    Aug. 17, 2023

(30) Foreign Application Priority Data

Feb. 17, 2022    (KR) ........................ 10-2022-0020514

(51) Int. Cl.
    *H10K 59/80*          (2023.01)
    *H10K 59/12*          (2023.01)
    (Continued)

(52) U.S. Cl.
    CPC ........... *H10K 59/877* (2023.02); *H10K 59/38* (2023.02); *H10K 71/00* (2023.02); *H10K 59/12* (2023.02); *H10K 59/1201* (2023.02)

(58) Field of Classification Search
    CPC ...... H10K 59/877; H10K 59/38; H10K 71/00; H10K 59/12; H10K 59/1201;
    (Continued)

(56) References Cited

U.S. PATENT DOCUMENTS 9,989,806 B2    6/2018  Lee et al.
10,269,882 B2   4/2019  Hanamura et al.
                (Continued)

FOREIGN PATENT DOCUMENTS

JP          6187051 B2     8/2017
KR    10-2007-0049172 A   5/2007
                (Continued)

*Primary Examiner* — Michael E Teitelbaum

(74) *Attorney, Agent, or Firm* — Womble Bond Dickinson (US) LLP

(57)          ABSTRACT

A display apparatus includes: a display element layer having first to third light-emitting regions and a non-light-emitting region, and including light-emitting elements along one direction and corresponding to the first to third light-emitting regions to provide source light; a light control unit on the display element layer, and including a base resin and scatters, and having openings overlapping with the first and second light-emitting regions; light conversion units in the openings, and including quantum dots; and first to third color filters on the light control unit and the light conversion units, and overlapping with the first to third light-emitting regions. The light control unit includes a first portion overlapping with the non-light-emitting region, and a second portion overlapping with the third light-emitting region, that form a step difference with each other; and a width of the first portion is greater than a thickness of the second portion.

11 Claims, 15 Drawing Sheets

(51) Int. Cl.
   *H10K 59/38*        (2023.01)
   *H10K 71/00*        (2023.01)
(58) Field of Classification Search
   CPC .... H10K 59/873; H10K 50/85; H10K 50/115;
                              H10K 71/13; G09F 9/30
   See application file for complete search history.

(56)                References Cited

U.S. PATENT DOCUMENTS

| | | | |
|---|---|---|---|
| 10,539,826 | B2 | 1/2020 | Lee et al. |
| 10,725,333 | B2 * | 7/2020 | Kim .................. G02F 1/136286 |
| 11,031,440 | B2 | 6/2021 | Kim et al. |
| 12,382,813 | B2 | 8/2025 | Seong et al. |
| 2008/0036367 | A1 | 2/2008 | Eida et al. |
| 2008/0129189 | A1 * | 6/2008 | Cok ....................... B82Y 30/00 |
| | | | 313/506 |
| 2017/0123317 | A1 * | 5/2017 | Kamura ................ G03F 7/0007 |
| 2021/0028327 | A1 * | 1/2021 | Lin ..................... H01L 25/0753 |
| 2023/0209962 | A1 | 6/2023 | Seong et al. |

FOREIGN PATENT DOCUMENTS

| | | | |
|---|---|---|---|
| KR | 10-2017-0031613 | A | 3/2017 |
| KR | 10-2062587 | B1 | 1/2020 |
| KR | 10-2020-0100903 | A | 8/2020 |
| KR | 10-2223421 | B1 | 3/2021 |
| KR | 10-2021-0099242 | A | 8/2021 |
| KR | 10-2021-0153191 | A | 12/2021 |

* cited by examiner

DISPLAY APPARATUS AND METHOD OF MANUFACTURING THE SAME

CROSS-REFERENCE TO RELATED APPLICATIONS

This application claims priority to and the benefit of Korean Patent Application No. 10-2022-0020514, filed on Feb. 17, 2022, the entire content of which is incorporated by reference herein.

BACKGROUND

1. Field

Aspects of embodiments of the present disclosure relate to a display apparatus having improved reliability, and a method of manufacturing the display apparatus.

2. Description of the Related Art

Multimedia display apparatuses, such as a television, a mobile phone, a tablet, a computer, a navigation system, and a game machine, may include a display panel configured to display an image. The display panel may include a plurality of pixels configured to display an image. Each of the pixels may include a light-emitting element configured to generate light, and a driving element connected to the light-emitting element.

The above information disclosed in this Background section is for enhancement of understanding of the background of the present disclosure, and therefore, it may contain information that does not constitute prior art.

SUMMARY

In order to improve the light output efficiency and color purity of a display apparatus, the display apparatus may include an optical functional layer including scatterers. However, as the density of the scatterers dispersed in the optical functional layer may be formed non-uniformly, a defect in the display apparatus may occur.

One or more embodiments of the present disclosure are directed to a display apparatus having improved reliability by including a uniform or substantially uniform density of scatterers in a light control unit that transmits source light provided from a light-emitting element, and in which a defect, such as a stain that is visibly recognized, may be prevented or substantially prevented.

According to one or more embodiments of the present disclosure, a display apparatus includes: a display element layer having first to third light-emitting regions, and a non-light-emitting region surrounding the first to third light-emitting regions, the display element layer including a plurality of light-emitting elements located along one direction and corresponding to the first to third light-emitting regions, respectively, each of the light-emitting elements configured to provide source light; a light control unit on the display element layer, the light control unit including a base resin and scatters, and having openings overlapping with the first and second light-emitting regions, respectively; light conversion units in the openings, respectively, and including quantum dots; and first to third color filters on the light control unit and the light conversion units, and overlapping with the first to third light-emitting regions, respectively. The light control unit includes a first portion overlapping with the non-light-emitting region, and a second portion overlapping with the third light-emitting region, the first portion and the second portion including the same material as each other, and forming a step difference with each other; and a width of the first portion in the one direction is greater than a thickness of the second portion in a thickness direction crossing the one direction.

In an embodiment, in a plan view, the width of the first portion may correspond to a distance between one end of the first portion defining an opening adjacent to the second portion and another end of the first portion forming the step difference.

In an embodiment, the thickness of the second portion may be smaller than a thickness of each of the light conversion units.

In an embodiment, a difference between the width of the first portion and the thickness of the second portion may be about 6 micrometers or more.

In an embodiment, the first portion and the second portion may include a first surface and a second surface, respectively, each of the first surface and the second surface facing the display element layer; and the second surface of the second portion may be spaced farther from the display element layer than the first surface of the first portion in the thickness direction.

In an embodiment, the first portion may surround the second portion in a plan view.

In an embodiment, the light control unit may surround the light conversion units in a plan view.

In an embodiment, at least two color filters from among the first to third color filters may overlap with each other at the non-light-emitting region.

In an embodiment, the first to third color filters may have different colors from each other.

In an embodiment, the light conversion units may include: a first light conversion unit overlapping with the first light-emitting region, and including a first quantum dot configured to convert the source light into a first light; and a second light conversion unit overlapping with the second light-emitting region, and including a second quantum dot configured to convert the source light into a second light different from the first light; the first light conversion unit may overlap with the first color filter; the second light conversion unit may overlap with the second color filter; and the light control unit may overlap with the third color filter.

In an embodiment, at least one of the first light conversion unit or the second light conversion unit may further include scatterers.

In an embodiment, the display apparatus may further include a low refractive index layer between the first to third color filters and the light control unit, and covering the first to third color filters.

According to one or more embodiments of the present disclosure, a display apparatus includes: a display element layer including first to third light-emitting elements, each of the first to third light-emitting elements being configured to provide source light; a light control unit on the display element layer, the light control unit including a base resin and scatterers, and having openings overlapping with the first and second light-emitting elements, and a recessed portion overlapping with the third light-emitting element; light conversion units in the openings, respectively, and including quantum dots; and first to third color filters overlapping with the first to third light-emitting elements, respectively. A distance between the recessed portion and an opening adjacent to the recessed portion is greater than a thickness of a portion in which the recessed portion is defined in the light control unit.

In an embodiment, a difference between the distance and the thickness may be about 6 micrometers or more.

In an embodiment, the recessed portion may overlap with the third color filter.

In an embodiment, the light control unit may surround the light conversion units in a plan view.

In an embodiment, at least two of the first to third color filters may overlap with each other at a region between the recessed portion and the opening.

According to one or more embodiments of the present disclosure, a method for manufacturing a display apparatus, includes: providing a substrate; forming color filters on the substrate; forming a preliminary light control unit on the color filters, the preliminary light control unit including a base resin and scatterers; providing a mask on the preliminary light control unit to form a light control unit having an opening and a recessed portion, the mask including a mask opening, a light blocking portion, and a semi-transmissive portion; forming a light conversion unit in the opening; and providing a display panel including a plurality of light-emitting elements on the light control unit. The opening and the recessed portion overlap with the plurality of light-emitting elements, respectively.

In an embodiment, the opening and the recessed portion may be formed to correspond to the mask opening and the semi-transmissive portion, respectively.

In an embodiment, the light conversion unit may be formed through an inkjet printing process.

BRIEF DESCRIPTION OF THE FIGURES

The above and other aspects and features of the present disclosure will be more clearly understood from the following detailed description of the illustrative, non-limiting embodiments with reference to the accompanying drawings. In the drawings.

DETAILED DESCRIPTION

Figure 1:
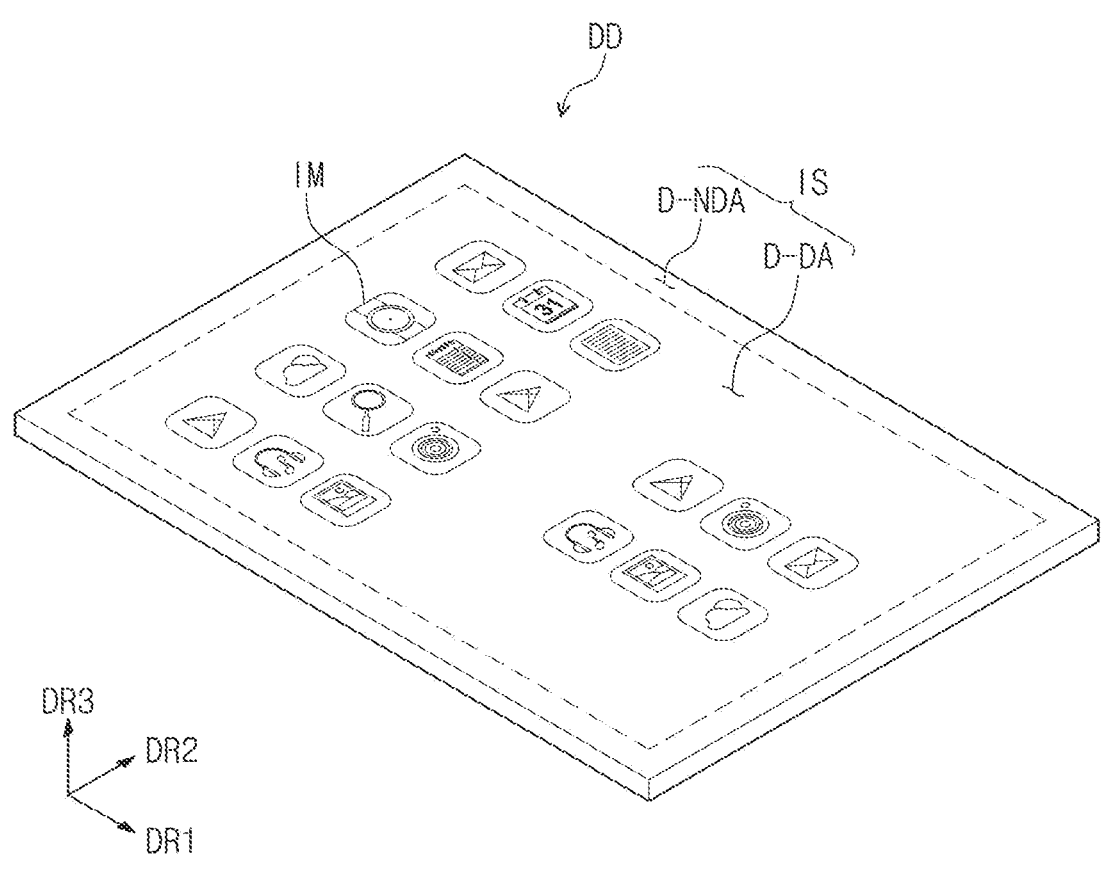
FIG. 1 is a perspective view of a display apparatus according to an embodiment of the present disclosure.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, dimensions, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a perspective view of a display apparatus according to an embodiment of the present disclosure.

The display apparatus DD may be activated according to an electrical signal, and may display an image IM. The display apparatus DD may include various suitable embodiments to provide the image IM to a user. For example, the display apparatus DD may be a large device, such as a television and an external billboard, or a small or medium-sized device, such as a monitor, a mobile phone, a tablet, a computer, a navigation system, and a game machine. However, the display apparatus DD is not limited thereto.

Referring to FIG. 1, the display apparatus DD may have a rectangular shape having long sides extending in a first direction DR1, and short sides extending in a second direction DR2 on a plane (e.g., in a plan view). However, the present disclosure is not limited thereto, and the display apparatus DD may have various suitable shapes, such as a circular shape or another polygonal shape.

The display apparatus DD may display the image IM in a third direction DR3 through a display surface IS that is parallel to or substantially parallel to a plane defined by the first and second directions DR1 and DR2. The third direction DR3 may be parallel to or substantially parallel to the normal direction of the display surface IS. The display surface IS at (e.g., in or on) which the image IM is displayed may correspond to a front surface of the display apparatus DD. The image IM may include a still image, as well as a dynamic image (e.g., a moving image). FIG. 1 illustrates various icons as an example of the image IM.

In the present embodiment, the front surface (or upper surface) and a rear surface (or lower surface) of each member or unit may be defined based on the direction (e.g., the third direction DR3) in which the image IM is displayed. The front surface and the rear surface may be opposite to each other in the third direction DR3, and the normal direction of each of the front surface and the rear surface may be parallel to or substantially parallel to the third direction DR3. A separation distance between the front surface and the rear surface defined along the third direction DR3 may correspond to a thickness of a member or unit.

As used in the present specification, the expressions "on a plane" and "in a plan view" may be defined as a state when viewed from the third direction DR3. As used in the present specification, the expressions "on a cross section" and "in a cross-sectional view" may be defined as a state when viewed from the first direction DR1 or the second direction DR2. However, the directions indicated by the first to third directions DR1, DR2, and DR3 are relative concepts, and may be converted into other suitable directions.

The display surface IS of the display apparatus DD may include a display portion D-DA and a non-display portion D-NDA. The display portion D-DA may be a portion in which the image IM is displayed at (e.g., in or on) the front surface of the display apparatus DD, and a user may visually recognize the image IM through the display portion D-DA. Although the present embodiment illustrates the display portion D-DA having a tetragonal shape on a plane (e.g., in a plan view) as an example, the display portion D-DA may have various suitable shapes according to the design of the display apparatus DD.

The non-display portion D-NDA may be a portion where the image IM is not displayed at (e.g., in or on) the front surface of the display apparatus DD. The non-display portion D-NDA may have a suitable color (e.g., a predetermined color), and may block light. The non-display portion D-NDA may be adjacent to the display portion D-DA. For example, the non-display portion D-NDA may be disposed outside the display portion D-DA to surround (e.g., around a periphery of) the display portion D-DA. However, the present disclosure is not limited thereto, and the non-display portion D-NDA may be adjacent to only one side of the display portion D-DA, may be disposed on a side surface of the display apparatus DD other than on the front side thereof, or may be omitted as needed or desired.

FIG. 1 illustrates, as an example, that the display apparatus DD has a planar display surface IS. However, the present disclosure is not limited thereto, and the display surface IS of the display apparatus DD may be curved, or may be three-dimensional.

The display apparatus DD may be flexible. The expression "may be flexible" refers to a property of being bendable, and a flexible structure may include a completely foldable structure to a structure that may be bent to a level of several nanometers. For example, a flexible display apparatus DD may be a curved device or a foldable device.

Without being limited thereto, the display apparatus DD may be a rigid display apparatus DD.

The display apparatus DD according to an embodiment of the present disclosure may sense an external input applied from the outside. The external input may have various suitable forms, such as externally provided pressure, temperature, light, and/or the like. The external input may include an input that is applied in proximity to the display apparatus DD (e.g., a hovering input), as well as an input that contacts the display apparatus DD (e.g., a touch input of a user's hand or a pen).

Figure 2:
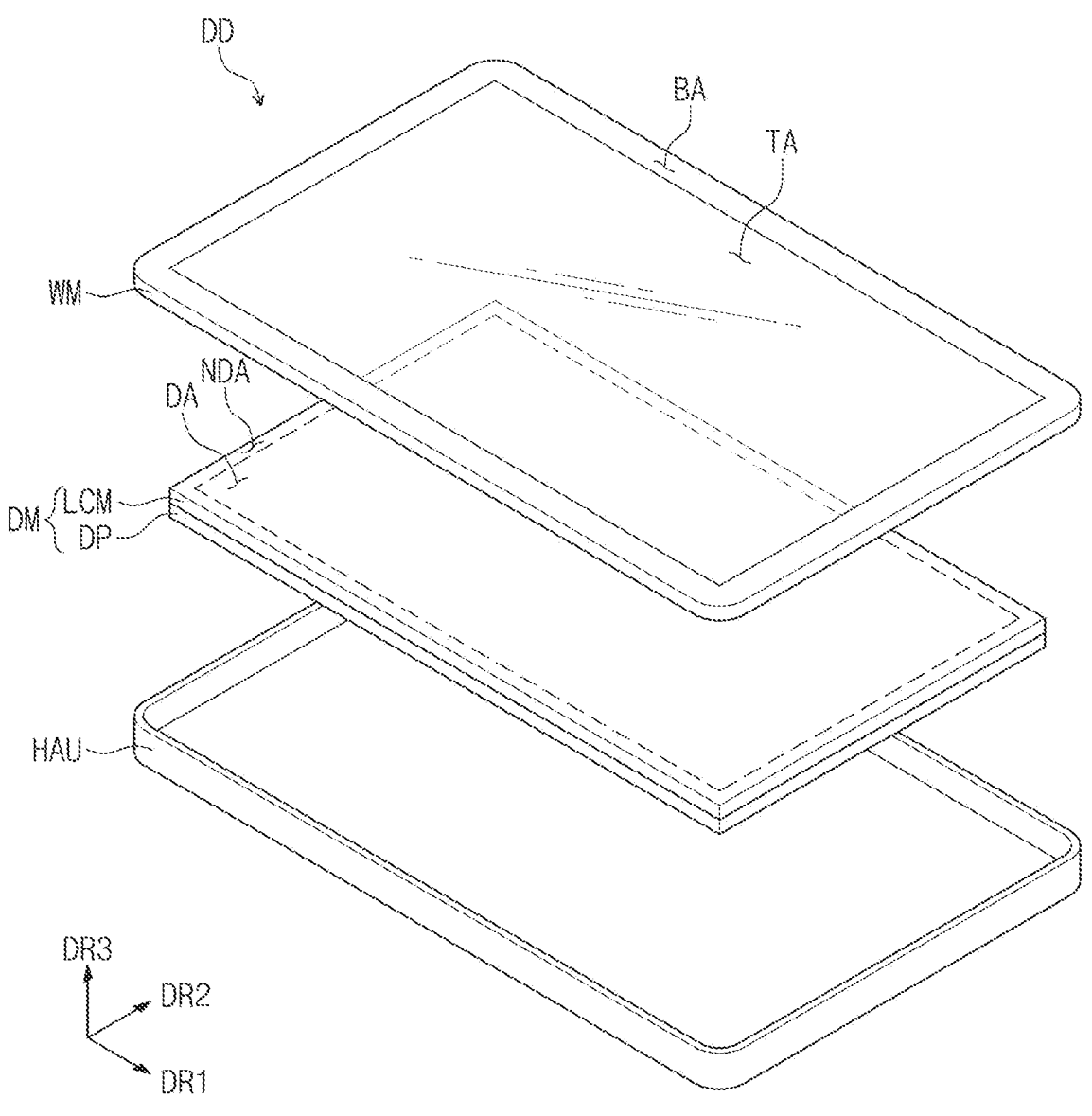
FIG. 2 is an exploded perspective view of the display apparatus according to an embodiment of the present disclosure.

FIG. 2 is an exploded perspective view of the display apparatus according to an embodiment of the present disclosure.

Referring to FIG. 2, the display apparatus DD may include a window WM, a display module (e.g., a display or a display layer) DM, and an outer case HAU. The display module DM may include a display panel DP, and a light control member LCM disposed on the display panel DP.

The window WM and the outer case HAU may be combined with (e.g., connected to or attached to) each other to form an exterior of the display apparatus DD, and may accommodate the various components of the display apparatus DD, such as the display module DM.

The window WM may be disposed on the display module DM. The window WM may protect the display module DM from an external impact. The front surface of the window WM may correspond to the display surface IS (e.g., refer to FIG. 1) of the display apparatus DD described above. The front surface of the window WM may include a transmission region TA and a bezel region BA.

The transmission region TA of the window WM may be an optically transparent region. The transmission region TA of the window WM may transmit an image provided by the display module DM, and a user may view the image. The transmission region TA may correspond to the display portion D-DA (e.g., refer to FIG. 1) of the display apparatus DD.

The window WM may include an optically transparent insulation material. For example, the window WM may include glass, sapphire, plastic, or the like. The window WM may have a single-layer structure or a multi-layered structure. The window WM may further include a functional layer, such as an anti-fingerprint layer, a phase control layer, and/or a hard coating layer disposed on an optically transparent substrate.

The bezel region BA of the window WM may be a region where a material having a suitable color (e.g., a predetermined color) is deposited, coated, or printed on the transparent substrate. The bezel region BA of the window WM may prevent or substantially prevent a configuration of the display module DM disposed to overlap with the bezel region BA from being visually recognized from the outside. The bezel region BA may correspond to the non-display portion D-NDA (e.g., refer to FIG. 1) of the display apparatus DD.

The display module DM may be disposed between the window WM and the outer case HAU. The display module DM may display an image according to an electrical signal. The display module DM may include a display region DA, and a non-display region NDA adjacent to the display region DA.

The display region DA may be activated according to an electrical signal. The display region DA may be a region from which an image provided by the display panel DP is output. The display region DA of the display module DM may overlap with at least a portion of the transmission region TA. The image output from the display region DA may be viewed from the outside through the transmission region TA.

The non-display region NDA may be adjacent to the display region DA. For example, the non-display region NDA may surround (e.g., around a periphery of) the display region DA. However, the present disclosure is not limited thereto, and the non-display region NDA may be defined in various suitable shapes. The non-display region NDA may be a region where a driving circuit or driving wiring configured to drive elements disposed at (e.g., in or on) the display region DA are disposed. Various suitable signal lines configured to provide electrical signals to the elements, and pads may be disposed at (e.g., in or on) the non-display region NDA. The non-display region NDA may overlap with at least a portion of the bezel region BA, and the bezel region BA may prevent or substantially prevent the various components of the display module DM that are disposed at (e.g., in or on) the non-display region NDA from being viewed from the outside.

The display panel DP according to an embodiment of the present disclosure may be a light-emitting display panel, but is not particularly limited thereto. For example, the display panel DP may be an organic light-emitting display panel, an inorganic light-emitting display panel, or a quantum dot light-emitting display panel. The light-emitting layer of the organic light-emitting display panel may contain an organic light-emitting material, and the light-emitting layer of the inorganic light-emitting display panel may contain an inorganic light-emitting material. The light-emitting layer of the quantum dot light-emitting display panel may contain quantum dots and/or quantum rods. Hereinafter, the display panel DP according to the present embodiment will be described in more detail in the context of an organic light-emitting display panel.

The light control member LCM may be disposed on the display panel DP. After being manufactured through a separate process, the light control member LCM may be provided on the display panel DP to be coupled to (e.g., connected to or attached to) the display panel DP through a bonding process. However, the present disclosure is not limited thereto, and the light control member LCM may be formed (e.g., directly formed) on the display panel DP through a continuous process.

The light control member LCM may selectively transmit light provided from the display panel DP, or may selectively convert a wavelength of the light. In addition, the light control member LCM may prevent or substantially prevent reflection of external light that may be incident from the outside of the display apparatus DD.

The outer case HAU may be disposed under (e.g., underneath) the display module DM to accommodate the display module DM. The outer case HAU may include a suitable material having a relatively high rigidity. The outer case HAU may absorb a shock applied to the display module DM from the outside, and may protect the display module DM by preventing or substantially preventing foreign substances and/or moisture from penetrating into the display module DM. The outer case HAU according to an embodiment of the present disclosure may be provided in a form in which a plurality of accommodation members are coupled to (e.g., connected to or attached to) each other.

In some embodiments, the display apparatus DD may further include an input sensing module (e.g., an input sensing layer or an input sensing panel) configured to obtain coordinate information of the external input applied from the outside of the display apparatus DD. The input sensing module of the display apparatus DD may be driven in various suitable methods, such as a capacitive method, a resistive method, an infrared method, a pressure method, or the like, but the present disclosure is not limited thereto.

In an embodiment of the present disclosure, the input sensing module may be disposed on the display module DM. The input sensing module may be directly disposed on the display module DM through a continuous process, but the present disclosure is not limited thereto, and the input sensing module may be manufactured separately from the display module DM and coupled to (e.g., connected to or attached to) the display module DM by an adhesive layer. In an embodiment of the present disclosure, the input sensing module may be disposed between various components of the display module DM. For example, the input sensing module may be disposed between the display panel DP and the light control member LCM.

Figure 3:
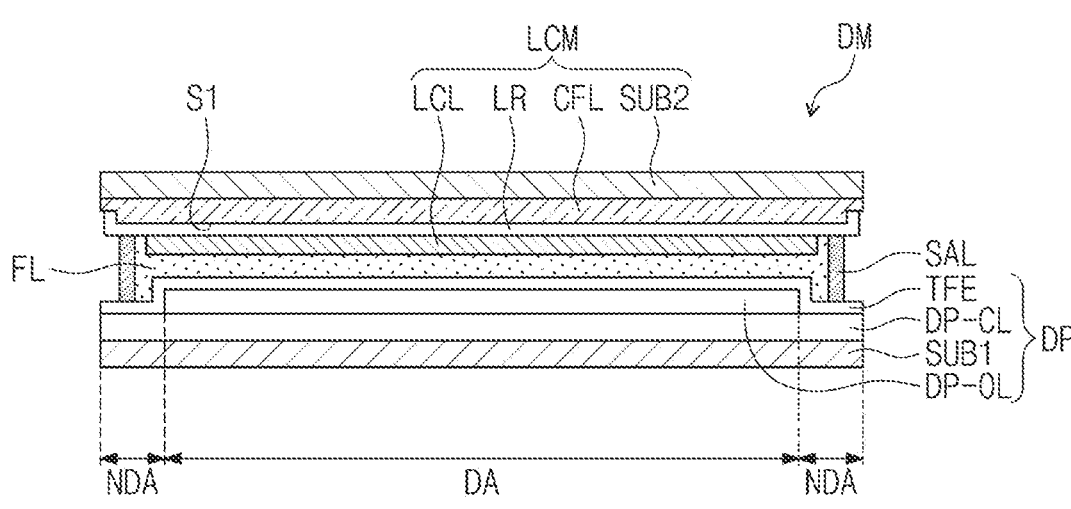
FIG. 3 is a cross-sectional view of a display module according to an embodiment of the present disclosure.
Figure 3:
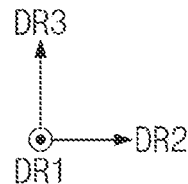

FIG. 3 is a cross-sectional view of a display module according to an embodiment of the present disclosure. Referring to FIG. 3, the display module (e.g., a display or a display layer) DM may include a display panel DP, a light control member LCM, a sealing member SAL disposed between the display panel DP and the light control member LCM, and a filling member FL. The display panel DP and the light control member LCM may be the same or substantially the same as (or similar to) those described above with reference to FIGS. 1 and 2, and thus, redundant description thereof may not be repeated.

Referring to FIG. 3, the display panel DP may include a lower substrate SUB1, a circuit layer DP-CL, a display element layer DP-OL, and an encapsulation layer TFE.

The lower substrate SUB1 may include a glass substrate, a polymer substrate, or an organic/inorganic composite material substrate. The lower substrate SUB1 may include an upper surface and a lower surface, which are parallel to or substantially parallel to each of the first and second directions DR1 and DR2. The lower substrate SUB1 may include a display region DA and a non-display region NDA, and may provide a base surface on which various components of the display panel DP are stacked. The circuit layer DP-CL, the display element layer DP-OL, and the encapsulation layer TFE may be formed by being sequentially stacked on the upper surface of the lower substrate SUB1 in the third direction DR3.

The display element layer DP-OL may include a plurality of light-emitting elements disposed at (e.g., in or on) the display region DA. The circuit layer DP-CL may be disposed between the display element layer DP-OL and the lower substrate SUB1, and may include driving elements, signal lines, and pads, which are connected to the light-emitting elements. The light-emitting elements of the display element layer DP-OL may provide a source light (e.g., a first light) toward the light control member LCM at (e.g., in or on) the display region DA.

The encapsulation layer TFE may be disposed on the display element layer DP-OL to seal the light-emitting elements. The encapsulation layer TFE may include a plurality of thin films. The thin films of the encapsulation layer TFE may be disposed to improve an optical efficiency of the light-emitting elements, and/or to protect the light-emitting elements.

The light control member LCM may include an upper substrate SUB2, a color filter layer CFL, a low refractive index layer LR, and a light conversion layer LCL.

The upper substrate SUB2 may include a glass substrate, a polymer substrate, or an organic/inorganic composite material substrate. The upper substrate SUB2 may include a front surface and a rear surface, which are parallel to or substantially parallel to each of the first direction DR1 and the second direction DR2. The rear surface of the upper substrate SUB2 may face the upper surface of the lower substrate SUB1. The upper substrate SUB2 may provide a base surface on which various components of the light control member LCM are stacked. The color filter layer CFL, the low refractive index layer LR, and the light conversion layer LCL may be formed by being sequentially stacked on the rear surface of the upper substrate SUB2 in the third direction DR3.

The light conversion layer LCL may include a light control unit (e.g., a light controller or a light control part) and a light conversion unit (e.g., a light converter or a light conversion part) disposed to overlap with the display region DA. The light conversion unit of the light conversion layer LCL may convert a wavelength of the source light provided by the light-emitting element. The light control unit of the light conversion layer LCL may transmit the source light. The light conversion layer LCL may extend from the display region DA, and may overlap with the non-display region NDA.

The color filter layer CFL may be disposed to overlap with the display region DA, and may filter light passing through the light conversion layer LCL. The color filter layer CFL may include a plurality of color filters, which display the same or substantially the same color as those of corresponding pixels. The color filter layer CFL may prevent or substantially prevent a color purity of the display apparatus DD (e.g., refer to FIG. 1) from being deteriorated, by absorbing light that has not been converted by the light conversion layer LCL and has passed therethrough. In addition, the color filter layer CFL may filter external light to be the same or substantially the same colors as those of the corresponding pixels, and may reduce external light reflectance of the display apparatus DD (e.g., refer to FIG. 1).

The color filter layer CFL may extend from the display region DA to overlap with the non-display region NDA. The color filter layer CFL may include color filters overlapping with each other at (e.g., in or on) the non-display region NDA to absorb light emitted through the non-display region NDA or reflected therefrom.

The sealing member SAL may be disposed between the display panel DP and the light control member LCM to couple (e.g., connect or attach) the display panel DP and the light control member LCM to each other. The sealing member SAL may overlap with the non-display region NDA. The display panel DP and the light control member LCM may be respectively formed through separate processes, and the display module DM may be manufactured by bonding the display panel DP and the light control member LCM to each other with the use of the sealing member SAL. The sealing member SAL may contain an ultraviolet curing material, but the material of the sealing member SAL is not limited to the above example.

The filling member FL is disposed between the display panel DP and the light control member LCM to fill an empty space between the display panel DP and the light control member LCM, which overlaps with the display region DA. In an embodiment of the present disclosure, the filling member FL may be disposed between the encapsulation layer TFE and the light conversion layer LCL. The filling member FL may contain a silicone, epoxy, or acrylic-based thermosetting material. However, the material of the filling member FL is not limited to the above examples.

In some embodiments, however, in the display module DM, the light control member LCM may be directly disposed on the display panel DP. The light control member LCM may be formed on the upper surface of the encapsulation layer TFE of the display panel DP through a continuous process. In this case, the sealing member SAL and the filling member FL may be omitted.

Figure 4:
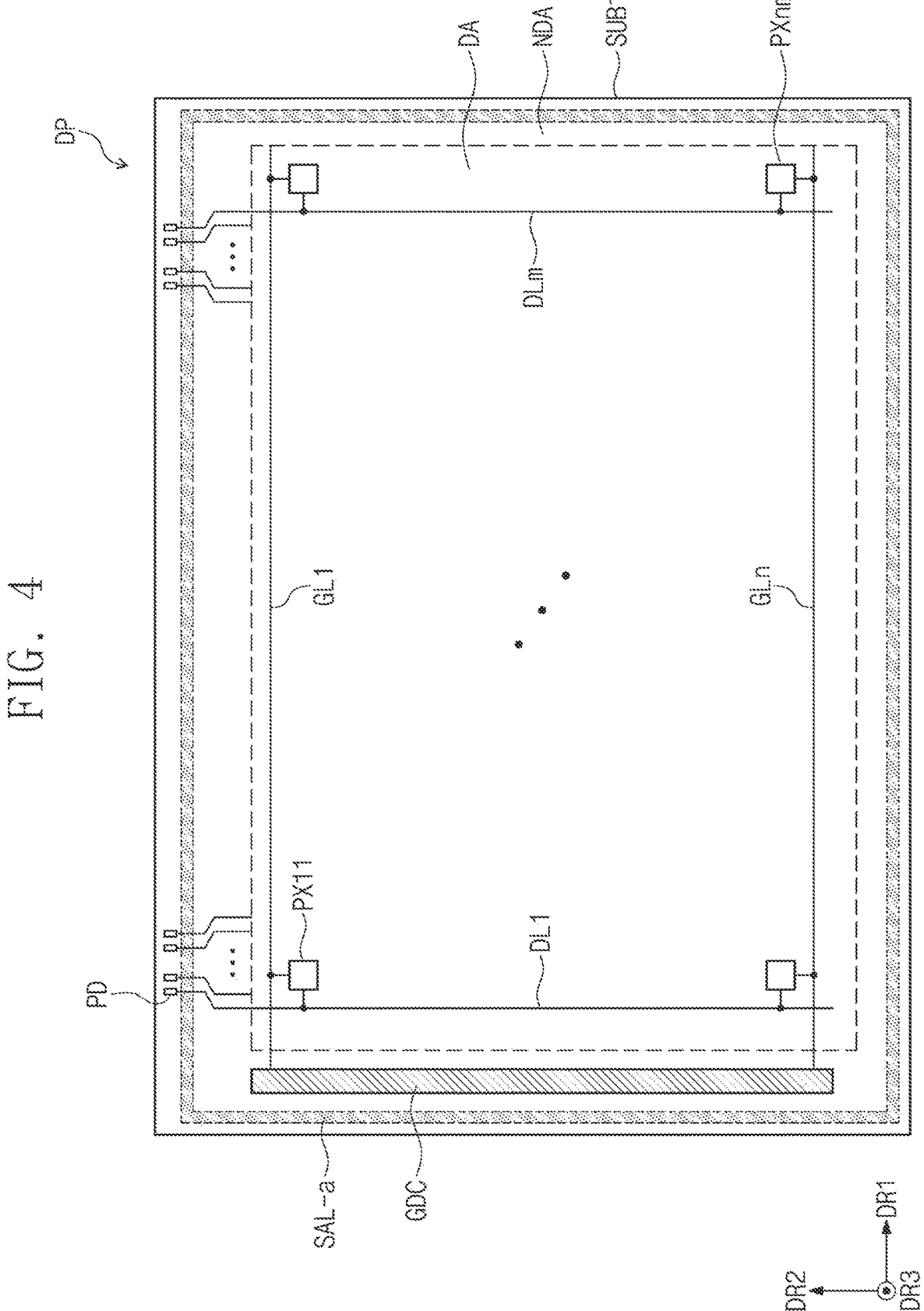
FIG. 4 is a plan view of a display panel according to an embodiment of the present disclosure.

FIG. 4 is a plan view of a display panel according to an embodiment of the present disclosure. FIG. 4 schematically illustrates an example configuration of the display panel DP as viewed in the third direction DR3.

Referring to FIG. 4, the lower substrate SUB1 of the display panel DP may include a display region DA and a non-display region NDA. The display panel DP may include a plurality of pixels PX11 to PXnm, signal lines GL1 to GLn and DL1 to DLm electrically connected to the pixels PX11 to PXnm, a driving circuit GDC, and pads PD, where n and m are natural numbers.

Each of the pixels PX11 to PXnm may include a light-emitting element, and a pixel driving circuit composed of a plurality of transistors (e.g., a switching transistor, a driving transistor, and the like) connected to the light-emitting element, which will be described in more detail below. The pixels PX11 to PXnm may emit light in response to an electrical signal applied to the pixels PX11 to PXnm.

The pixels PX11 to PXnm may be disposed at (e.g., in or on) the display region DA. However, the present disclosure is not limited thereto, and in some embodiments, transistors constituting some pixels from among the pixels PX11 to PXnm may be disposed at (e.g., in or on) the non-display region NDA. Although FIG. 4 illustrates the pixels PX11 to PXnm arranged in a matrix form as an example, the arrangement form of the pixels PX11 to PXnm is not limited thereto.

The signal lines GL1 to GLn and DL1 to DLm may include gate lines GL1 to GLn and data lines DL1 to DLm. Each of the pixels PX11 to PXnm may be connected to a corresponding gate line from among the gate lines GL1 to GLn, and a corresponding data line from among the data lines DL1 to DLm. More types of signal lines may be provided in the display panel DP according to a desired configuration of the pixel driving circuit of the pixels PX11 to PXnm.

The driving circuit GDC may be disposed at (e.g., in or on) the non-display region NDA. However, the present disclosure is not limited thereto, and a portion of the driving circuit GDC may be disposed at (e.g., in or on) the display region DA, and thus, the area of the non-display region NDA may be minimized or reduced, for example. The driving circuit GDC may include a gate driving circuit. The gate driving circuit may generate gate signals, and may output (e.g., sequentially output) the gate signals to the gate lines GL1 to GLn. The gate driving circuit may further output another control signal to the pixel driving circuit of the pixels PX11 to PXnm.

The pads PD may be disposed at (e.g., in or on) the non-display region NDA along one direction. The pads PD may be parts that are connected to a circuit board. Each of the pads PD may be connected to a corresponding signal line from among the plurality of signal lines GL1 to GLn and DL1 to DLm, and connected to a corresponding pixel through a signal line. The pads PD may have an integral shape with the signal lines GL1 to GLn and DL1 to DLm. However, the present disclosure is not limited thereto, and the pads PD may be disposed at (e.g., in or on) a layer different from those of the signal lines GL1 to GLn and DL1 to DLm to be connected thereto through a contact hole.

FIG. 4 illustrates, an example on a plane (e.g., in a plan view) of a sealing member arrangement region SAL-a corresponding to a region in which the sealing member SAL (e.g., refer to FIG. 3) is disposed. The sealing member arrangement region SAL-a may correspond to a portion of the non-display region NDA. The sealing member arrangement region SAL-a may be adjacent to an edge of the display panel DP, and may extend along the extension direction of the edge. The sealing member arrangement region SAL-a may surround (e.g., around a periphery of) the display region DA on a plane (e.g., in a plan view). In an embodiment of the present disclosure, the sealing member arrangement region SAL-a may be located outside a region in which the driving circuit GDC is disposed.

Figure 5:
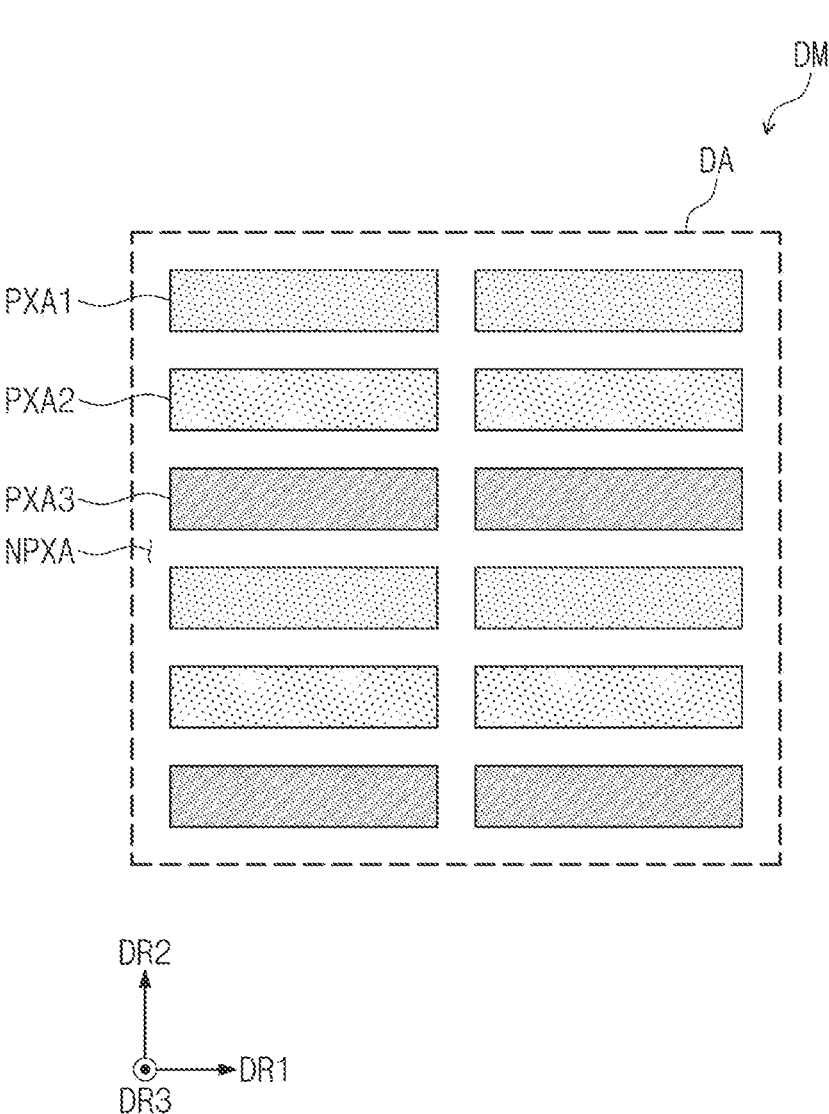
FIG. 5 is an enlarged plan view of the display module according to an embodiment of the present disclosure.

FIG. 5 is an enlarged plan view of the display module according to an embodiment of the present disclosure. FIG. 5 is an enlarged view of a portion corresponding to the aforementioned display region DA.

Referring to FIG. 5, the display region DA may include light-emitting regions PXA1, PXA2, and PXA3 corresponding to the light-emitting elements, and a non-light-emitting region NPXA surrounding (e.g., around peripheries of) the light-emitting regions PXA1, PXA2, and PXA3. FIG. 5 illustrates an example of the arrangement and shape of the light-emitting regions PXA1, PXA2, and PXA3.

The light-emitting regions PXA1, PXA2, and PXA3 may be regions corresponding to three pixels arranged in a direction parallel to or substantially parallel to the second direction DR2 from among the pixels PX11 to PXnm (e.g., refer to FIG. 4). In more detail, the light-emitting regions PXA1, PXA2, and PXA3 may correspond to regions in which light is emitted by three pixels, respectively.

The light-emitting regions PXA1, PXA2, and PXA3 may include a first light-emitting region PXA1, a second light-emitting region PXA2, and a third light-emitting region PXA3. The first to third light-emitting regions PXA1, PXA2, and PXA3 may be classified according to the color of light emitted toward the outside of the display apparatus DD. The non-light-emitting region NPXA may define a boundary between the first to third light-emitting regions PXA1, PXA2, and PXA3, and may prevent or substantially prevent color mixing between the first to third light-emitting regions PXA1, PXA2, and PXA3.

One of the first to third light-emitting regions PXA1, PXA2, and PXA3 may provide a first color light corresponding to the source light provided by the light-emitting element, another thereamong may provide a second color light different from the first color light, and the remaining one thereof may provide a third color light different from the first color light and the second color light. For example, the first color light may be blue light, the second color light may be red light, and the third color light may be green light. However, the color light are not necessarily limited to the above examples.

The first to third light-emitting regions PXA1, PXA2, and PXA3 may be repeatedly arranged in a suitable arrangement (e.g., a predetermined arrangement) at (e.g., in or on) the display region DA. The first to third light-emitting regions PXA1, PXA2, and PXA3 may be arranged along the first direction DR1 and the second direction DR2. As shown in FIG. 5, in an embodiment of the present disclosure, each of the first light-emitting regions PXA1, the second light-emitting regions PXA2, and the third light-emitting regions PXA3 may be arranged along the first direction DR1. The first light-emitting regions PXA1, the second light-emitting regions PXA2, and the third light-emitting regions PXA3 may be sequentially arranged along the second direction DR2. However, without being limited to the embodiment illustrated in FIG. 5, the arrangement of the first to third light-emitting regions PXA1, PXA2, and PXA3 may be designed in various suitable ways.

The first to third light-emitting regions PXA1, PXA2, and PXA3 may have various suitable shapes on a plane (e.g., in a plan view). For example, as illustrated in FIG. 5, each of the first to third light-emitting regions PXA1, PXA2, and PXA3 may have a tetragonal shape. However, the present disclosure is not limited thereto, and each of the first to third light-emitting regions PXA1, PXA2, and PXA3 may have a polygonal, circular, elliptical, or irregular shape.

The first to third light-emitting regions PXA1, PXA2, and PXA3 may have the same or substantially the shape as each other on a plane (e.g., in a plan view). However, the present disclosure is not limited thereto, and at least some of the first to third light-emitting regions PXA1, PXA2, and PXA3 may have different shapes from one another.

The first to third light-emitting regions PXA1, PXA2, and PXA3 may have the same or substantially the same area (e.g., size) on a plane (e.g., in a plan view). However, the present disclosure is not limited thereto, and at least some of the first to third light-emitting regions PXA1, PXA2, and PXA3 may have different areas (e.g., size) from one another on a plane (e.g., in a plan view), and the sizes of the areas may be determined according to the color of output light. For example, the area of the light-emitting region that outputs light in the color green from among the primary colors may be the greatest (e.g., the largest), and the area of the light-emitting region that outputs blue light may be the smallest.

The embodiment illustrated in FIG. 5 is provide as an example, and the shape, area, and arrangement of the first to third light-emitting regions PXA1, PXA2, and PXA3 may be designed in various suitable ways according to the output efficiency of light, and the design of the display module DM.

Figure 6:
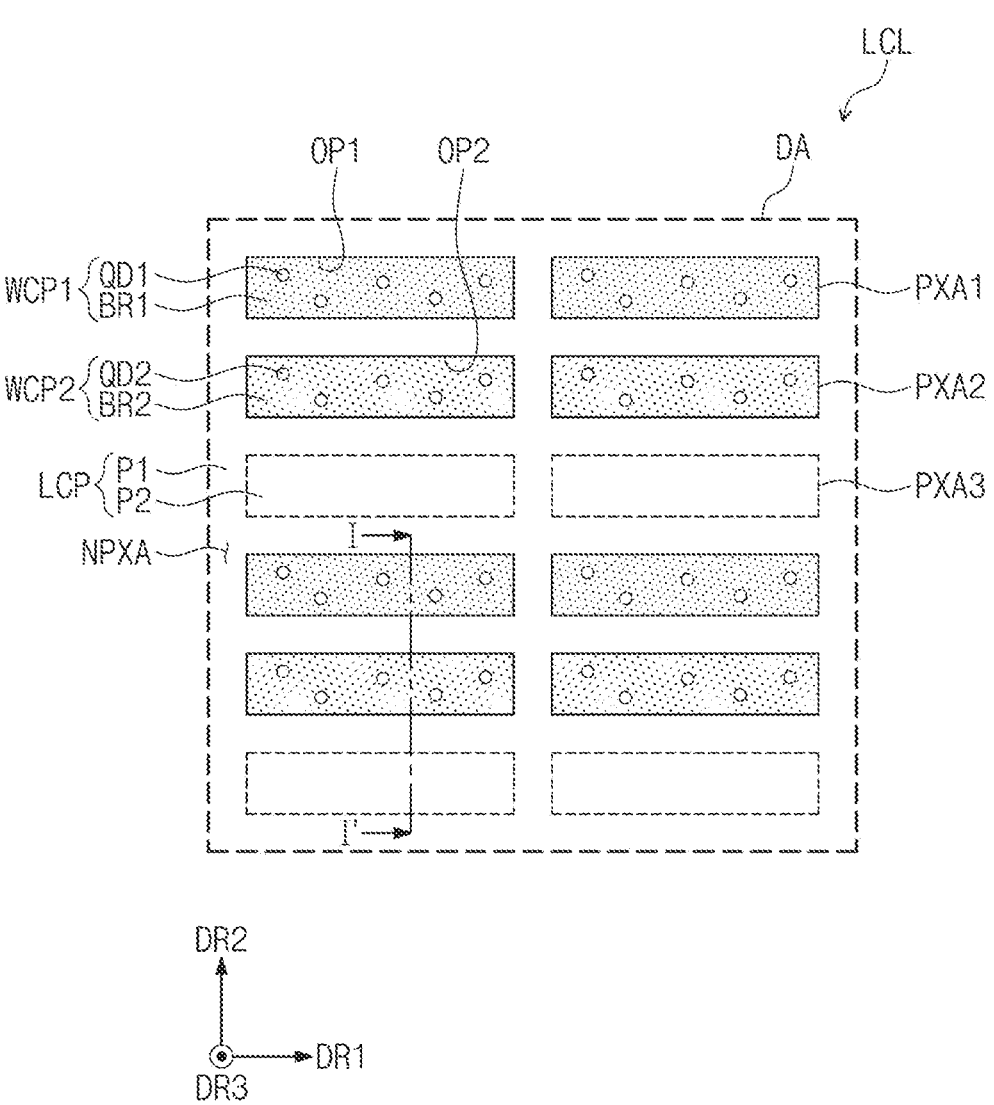
FIG. 6 is an enlarged plan view of a light conversion layer according to an embodiment of the present disclosure.
Figure 7A:
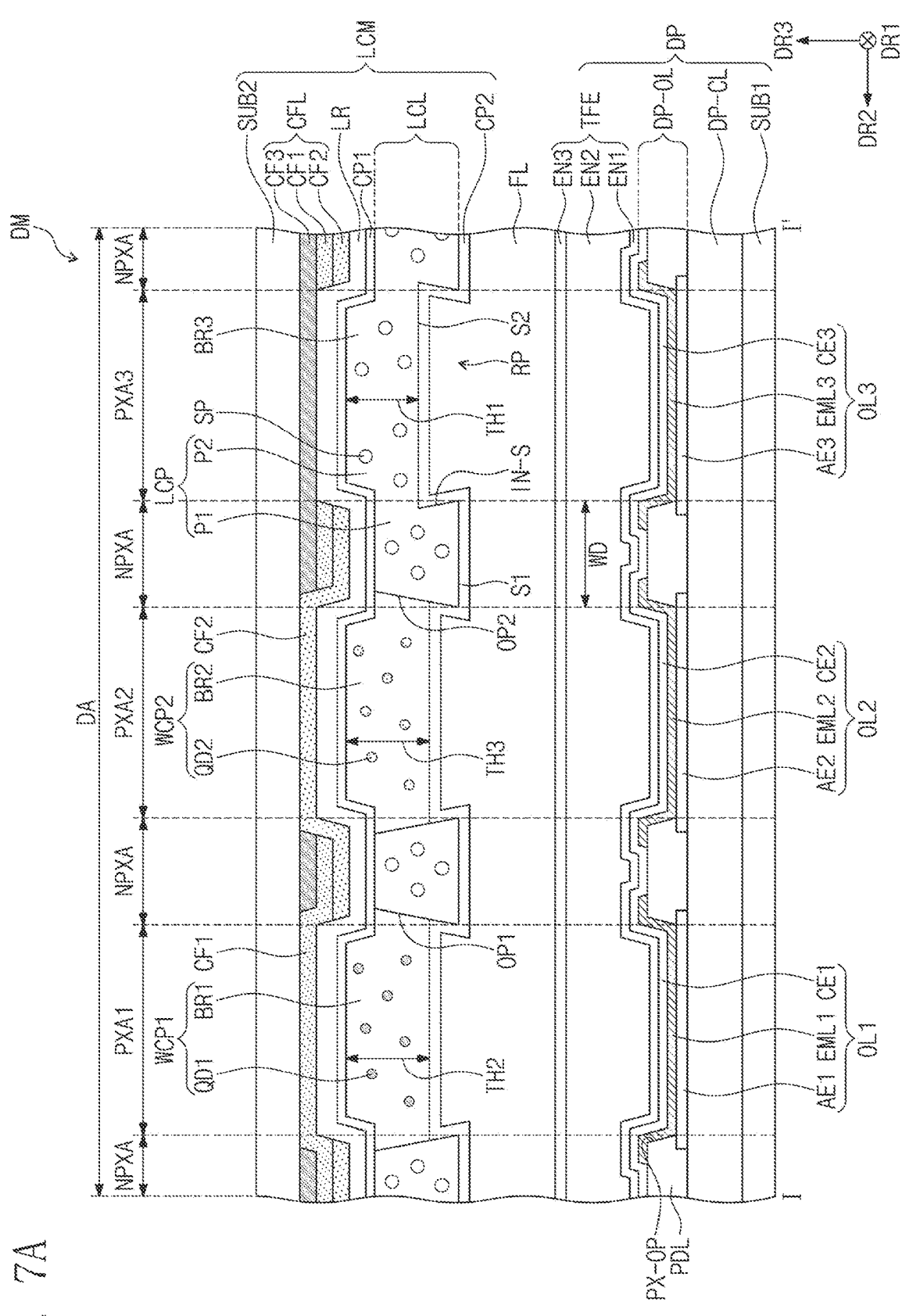
FIG. 7A is a cross-sectional view of the display module according to an embodiment of the present disclosure.
Figure 7B:
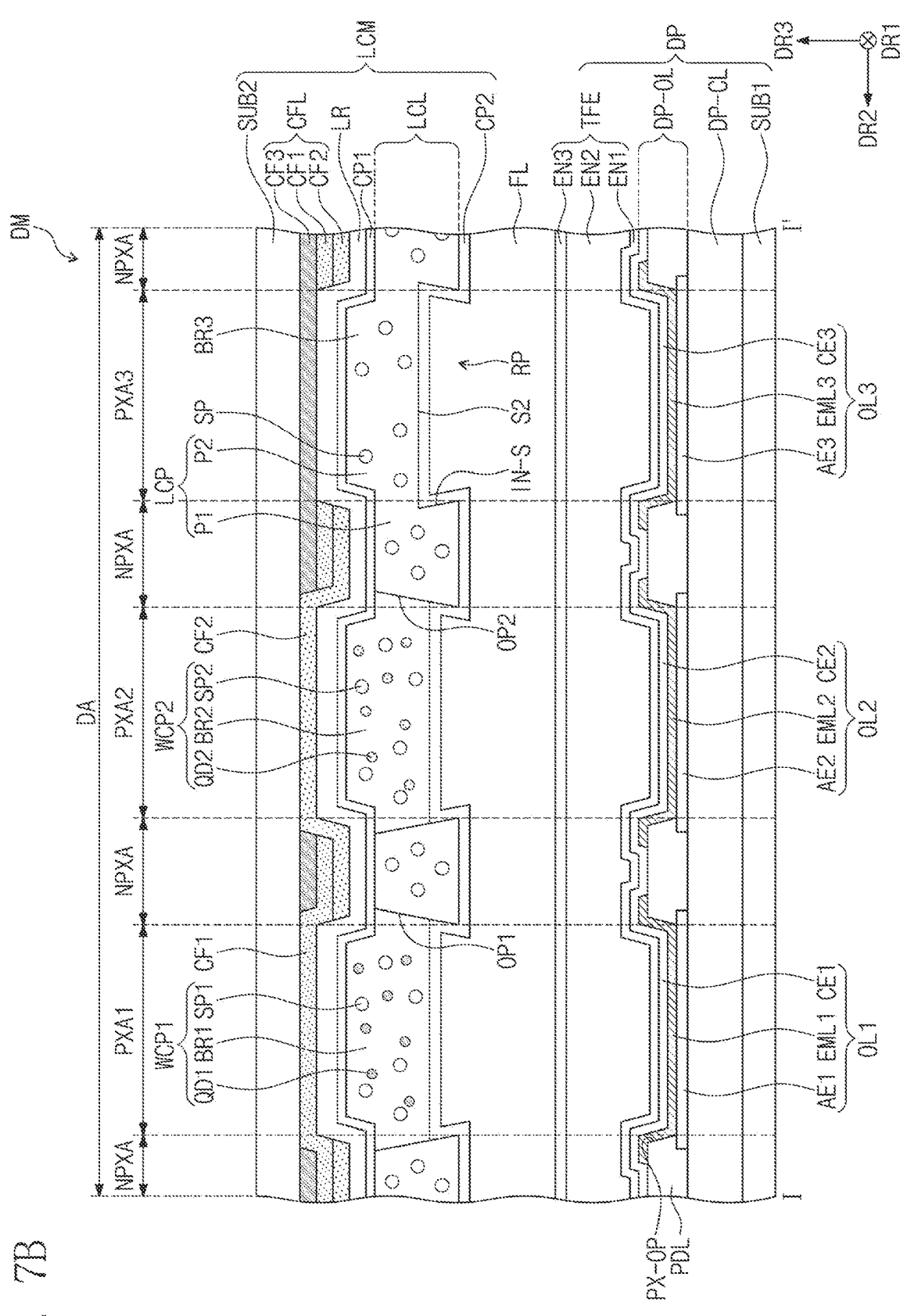
FIG. 7B is a cross-sectional view of the display module according to an embodiment of the present disclosure.

FIG. 6 is an enlarged plan view of a light conversion layer according to an embodiment of the present disclosure. FIG. 6 is a schematic plan view of the light conversion layer LCL corresponding to the display region DA illustrated in FIG. 5. FIGS. 7A and 7B are cross-sectional views of the display module according to one or more embodiments, and correspond to the line I-I' of FIG. 6. The embodiments illustrated in FIGS. 7A and 7B include the same or substantially the same (or similar) configuration as each other, but there may be some differences in the configuration of light conversion units (e.g., light conversion parts) WCP1 and WCP2.

Referring to FIGS. 6 and 7A, the light conversion layer LCL may include the light conversion units WCP1 and WCP2, and a light control unit (e.g., a light control part) LCP. The light conversion layer LCL will be described in more detail below.

Referring to FIG. 7A, the display panel DP may include a lower substrate SUB1, a circuit layer DP-CL, a display element layer DP-OL, and an encapsulation layer TFE, which may be the same or substantially the same as (or similar to) those described above, and thus, redundant description thereof may not be repeated.

The display panel DP may include an insulating layer, a semiconductor pattern, a conductive pattern, a signal line, and the like. In the manufacturing of the display panel DP, an insulating layer, a semiconductor layer, and a conductive layer may be formed on the lower substrate SUB1 by coating, deposition, or the like, and then, the insulating layer, the semiconductor layer, and the conductive layer may be selectively patterned through a photolithography process. Through such a process, the semiconductor pattern, the conductive pattern, the signal line, and the like included in the display panel DP may be formed.

The lower substrate SUB1 may provide a base surface on which the circuit layer DP-CL is formed. The lower substrate SUB1 may have a single-layer structure or a multilayered structure. For example, the lower substrate SUB1 having a multi-layered structure may include synthetic resin layers and at least one inorganic layer disposed between the synthetic resin layers, or may include a glass substrate and a synthetic resin layer disposed on the glass substrate. However, structure of the lower substrate SUB1 is not limited thereto.

The synthetic resin layer included in the lower substrate SUB1 may contain at least one of acrylic-based resin, methacrylic-based resin, polyisoprene, vinyl-based resin, epoxy-based resin, urethane-based resin, cellulose-based resin, siloxane-based resin, polyamide-based resin, perylene-based resin, or a polyimide-based resin. However, the material of the synthetic resin layer is not limited to the above examples.

The circuit layer DP-CL may include driving elements constituting the equivalent circuit of the pixels. For example, the circuit layer DP-CL may include at least one insulating layer, transistors connected to light-emitting elements OL1, OL2, and OL3, signal lines, and the like. The transistors may include semiconductor patterns, and the semiconductor patterns may be arranged in a suitable rule (e.g., a predetermined rule) on a plane (e.g., in a plan view) according to the configuration of the equivalent circuit of the pixels. The semiconductor patterns may contain polysilicon, amorphous silicon, crystalline oxide, or noncrystalline oxide.

The display element layer DP-OL may be disposed on the circuit layer DP-CL. The display element layer DP-OL may include the first to third light-emitting regions PXA1, PXA2, and PXA3, and the non-light-emitting region NPXA, which have been described above. The display element layer DP-OL may include a plurality of light-emitting elements OL1, OL2, and OL3, and a pixel defining film PDL.

The light-emitting elements OL1, OL2, and OL3 may include first to third light-emitting elements OL1, OL2, and OL3 corresponding to the first to third light-emitting regions PXA1, PXA2, and PXA3, respectively. Each of the first to third light-emitting elements OL1, OL2, and OL3 may include a first electrode AE1, AE2, and AE3, a light-emitting layer EML1, EML2, and EML3, and a second electrode CE1, CE2, and CE3.

The first electrodes AE1, AE2, and AE3 of the first to third light-emitting elements OL1, OL2, and OL3 may be disposed to be spaced apart from each other on the circuit layer DP-CL. The first electrodes AE1, AE2, and AE3 of the first to third light-emitting elements OL1, OL2, and OL3 may be connected to the corresponding transistors of the circuit layer DP-CL.

The pixel defining film PDL may be disposed on the circuit layer DP-CL. For example, the pixel defining film PDL may be disposed on an uppermost insulating layer of the circuit layer DP-CL. The pixel defining film PDL may have light-emitting openings PX-OP exposing at least a portion of each of the first electrodes AE1, AE2, and AE3 of the first to third light-emitting elements OL1, OL2, and OL3. The regions of the first electrodes AE1, AE2, and AE3 of the first to third light-emitting elements OL1, OL2, and OL3 exposed by the light-emitting openings PX-OP may correspond to the first to third light-emitting regions PXA1, PXA2, and PXA3, respectively. The pixel defining film PDL may correspond to the non-light-emitting region NPXA surrounding (e.g., around peripheries of) the first to third light-emitting regions PXA1, PXA2, and PXA3.

The pixel defining film PDL may contain a polymer resin. For example, the pixel defining film PDL may contain a polyacrylate-based resin or a polyimide-based resin. The pixel defining film PDL may further contain an inorganic material, in addition to the polymer resin. The present disclosure is not limited thereto, and the pixel defining film PDL may be formed of an inorganic material. For example, the pixel defining film PDL may contain silicon nitride ($SiN_x$), silicon oxide ($SiO_x$), silicon oxynitride ($SiO_xN_y$), and/or the like.

In an embodiment of the present disclosure, the pixel defining film PDL may further contain a light absorbing material. For example, the pixel defining film PDL may contain a black coloring agent. The black coloring agent may include a black dye and a black pigment. The black coloring agent may contain carbon black, a metal such as chromium, or an oxide thereof. However, the pixel defining film PDL is not limited thereto.

The light-emitting layers EML1, EML2, and EML3 of the first to third light-emitting elements OL1, OL2, and OL3 may be disposed on the first electrodes AE1, AE2, and AE3, respectively. The light-emitting layers EML1, EML2, and EML3 of the first to third light-emitting elements OL1, OL2, and OL3 may be disposed to correspond to the light-emitting openings PX-OP, respectively. The present disclosure is not limited thereto, and the light-emitting layers EML1, EML2, and EML3 of the first to third light-emitting elements OL1, OL2, and OL3 may be provided as a common layer having an integral shape.

Each of the light-emitting layers EML1, EML2, and EML3 may contain an organic light-emitting material, an inorganic light-emitting material, a quantum dot, a quantum rod, and/or the like. Each of the light-emitting layers EML1, EML2, and EML3 of the first to third light-emitting elements OL1, OL2, and OL3 may generate source light. Here, the source light may be a first color light. For example, the first color light may be blue light, but the present disclosure is not limited thereto.

The light-emitting layers EML1, EML2, and EML3 of the first to third light-emitting elements OL1, OL2, and OL3 may have the same or substantially the same configuration and/or thickness as each other. However, the present disclosure is not limited thereto, and the configurations and/or thicknesses of the light-emitting layers EML1, EML2, and EML3 of the first to third light-emitting elements OL1, OL2, and OL3 may be different from each other.

Each of the first to third light-emitting elements OL1, OL2, and OL3 may have a tandem structure in which a plurality of light-emitting layers are provided. The light-emitting layers included in each of the first to third light-emitting elements OL1, OL2, and OL3 may generate the same or substantially the same color light as each other, but the present disclosure is not limited thereto, and some of the layers may generate different color lights. For example, each of the light-emitting elements OL1, OL2, and OL3 may include four light-emitting layers, and all of the four light-emitting layers may generate or substantially generate blue light. The present disclosure is not limited thereto, and in an embodiment of the present disclosure, three of the four light-emitting layers may generate blue light, and one light-emitting layer may generate green light. The light-emitting elements OL1, OL2, and OL3 having a tandem structure may further include functional layers, such as a hole control layer, an electron control layer, and a charge generation layer, which are disposed between the light-emitting layers.

The second electrodes CE1, CE2, and CE3 of the first to third light-emitting elements OL1, OL2, and OL3 may be disposed on the light-emitting layers EML1, EML2, and EML3. The second electrodes CE1, CE2, and CE3 of the first to third light-emitting elements OL1, OL2, and OL3 may be connected to each other to be provided as a common layer having an integral shape. The second electrodes CE1, CE2, and CE3 connected to each other may overlap with the light-emitting regions PXA1, PXA2, and PXA3 and the non-light-emitting region NPXA. A common voltage may be provided to the pixels through the second electrodes CE1, CE2, and CE3 that are connected to each other.

A first voltage (e.g., a predetermined first voltage) may be applied to the first electrodes AE1, AE2, and AE3 of each of the light-emitting elements OL1, OL2, and OL3, and a second voltage, which is different from the first voltage, may be applied to the second electrodes CE1, CE2, and CE3. Holes and electrons injected into the light-emitting layers EML1, EML2, and EML3 may be combined with each other to form excitons, and while the excitons transition to a ground state, the light-emitting elements OL1, OL2, and OL3 may emit light.

The light-emitting elements OL1, OL2, and OL3 may further include light-emitting functional layers, such as a hole control layer and an electron control layer, which are disposed between the first electrodes AE1, AE2, and AE3 and the second electrodes CE1, CE2, and CE3. The hole control layer may be disposed between a first electrode and a light-emitting layer, and may include at least one of a hole transport layer or a hole injection layer. The electron control layer may be disposed between a light-emitting layer and a second electrode, and may include at least one of an electron transport layer or an electron injection layer. The light-emitting functional layers of the light-emitting elements OL1, OL2, and OL3 may be provided as a common layer, and may overlap with the light-emitting regions PXA1, PXA2, and PXA3 and the non-light-emitting region NPXA.

The encapsulation layer TFE may be disposed on the display element layer DP-OL to seal the light-emitting elements OL1, OL2, and OL3. The encapsulation layer TFE may include first to third encapsulation films EN1, EN2, and EN3. The first encapsulation film EN1 may be disposed on the second electrodes CE1, CE2, and CE3, and the second encapsulation film EN2 and the third encapsulation film EN3 may be sequentially disposed on the first encapsulation film EN1.

In an embodiment of the present disclosure, the first and third encapsulation films EN1 and EN3 may include an inorganic film, and the inorganic film may protect the display element layer DP-OL from moisture and/or oxygen. For example, the inorganic film may contain at least one of aluminum oxide, titanium oxide, silicon oxide, silicon nitride, silicon oxynitride, zirconium oxide, or hafnium oxide, but the present disclosure is not limited to the above examples.

In an embodiment of the present disclosure, the second encapsulation film EN2 may include an organic film, and the organic film may protect the display element layer DP-OL from foreign substances, such as dust particles. For example, the organic film may contain an acrylic-based resin, but the present disclosure is not limited to the above example.

The filling member FL may be disposed between the display panel DP and the light control member LCM. The separation space between the display panel DP and the light control member LCM may be filled with the filling member FL. However, the present disclosure is not limited thereto, and the filling member FL may be omitted, such that the light control member LCM may be directly disposed on the display panel DP.

The display module DM according to an embodiment of the present disclosure may further include a column spacer disposed between the display panel DP and the light control member LCM, and overlapping with the non-light-emitting region NPXA. The column spacer may be surrounded (e.g., around a periphery thereof) by the filling member FL. The column spacer may support the display panel DP and the light control member LCM, so that the display panel DP and the light control member LCM are flatly or substantially flatly bonded to each other.

The light control member LCM may include an upper substrate SUB2, a color filter layer CFL, a low refractive index layer LR, a light conversion layer LCL, a first capping layer CP1, and a second capping layer CP2, which are disposed on the display panel DP. The rear surface of the upper substrate SUB2 may face the upper surface of the lower substrate SUB1. The color filter layer CFL, the low refractive index layer LR, the first capping layer CP1, the light conversion layer LCL, and the second capping layer CP2 may be sequentially disposed on the rear surface of the upper substrate SUB2 in the third direction DR3.

Referring to FIGS. 6 and 7A, the light conversion units WCP1 and WCP2 and the light control unit LCP may be disposed between the low refractive index layer LR and the display panel DP. The light conversion units WCP1 and WCP2 and the light control unit LCP may be disposed at (e.g., in or on) the same layer as each other.

The light control unit LCP may have a plurality of openings OP1 and OP2 defined therein. Each of the openings OP1 and OP2 may be formed to pass through the light control unit LCP. The openings OP1 and OP2 may include a first opening OP1 overlapping with the first light-emitting element OL1, and a second opening OP2 overlapping with the second light-emitting element OL2. The first opening OP1 may overlap with the first light-emitting region PXA1, and the second opening OP2 may overlap with the second light-emitting region PXA2. The planar area of the first opening OP1 may be equal to or substantially equal to or larger than the area of the first light-emitting region PXA1. The planar area of the second opening OP2 may be equal to or substantially equal to or larger than the area of the second light-emitting region PXA2.

The light conversion units WCP1 and WCP2 may include a first light conversion unit WCP1 disposed in the first opening OP1, and a second light conversion unit WCP2 disposed in the second opening OP2. The light control unit LCP may surround (e.g., around peripheries of) the first and second light conversion units WCP1 and WCP2 on a plane (e.g., in a plan view).

Referring to FIG. 6, each of the first and second openings OP1 and OP2 may be provided in a plurality to correspond to the plurality of first and second light-emitting regions PXA1 and PXA2. In this case, each of the first light conversion unit WCP1 and the second light conversion unit WCP2 may be provided in a plurality. The first light conversion units WCP1 may be respectively disposed in the first openings OP1, and the second light conversion units WCP2 may be respectively disposed in the second openings OP2.

Referring to FIGS. 6 and 7A, the first light conversion unit WCP1 may overlap with the first light-emitting element OL1, and the second light conversion unit WCP2 may overlap with the second light-emitting element OL2. In other words, the first light conversion unit WCP1 may overlap with the first light-emitting region PXA1, and the second light conversion unit WCP2 may overlap with the second light-emitting region PXA2.

The first light conversion unit WCP1 may include a base resin BR1, and first quantum dots QD1 dispersed in the base resin BR1. The first quantum dots QD1 may convert the first light provided by the first light-emitting element OL1 into a second light having a wavelength range different from that of the first light. The second light conversion unit WCP2 may include a base resin BR2, and second quantum dots QD2 dispersed in the base resin BR2. The second quantum dots QD2 may convert the first light provided by the second light-emitting element OL2 into a third light having a wavelength range different from that of the first light. Here, the wavelength range of the second light and the wavelength range of the third light may be different from each other. For example, the first quantum dots QD1 may convert the source light provided by the first light-emitting element OL1 into red light, and the second quantum dots QD2 may convert the source light provided by the second light-emitting element OL2 into green light. The first and second quantum dots QD1 and QD2 will be described in more detail below.

The light control unit LCP may overlap with the third light-emitting element OL3. The light control unit LCP overlapping with the third light-emitting region PXA3 may transmit the first light provided by the third light-emitting element OL3. For example, the third light-emitting element OL3 may provide blue light, and the blue light may pass through the light control unit LCP to be emitted toward the front surface of the display module DM.

In other words, in an embodiment of the present disclosure, the display module DM may emit red light through the first light-emitting region PXA1, green light through the second light-emitting region PXA2, and blue light through the third light-emitting region PXA3. The display module DM may display an image (e.g., a predetermined image) at (e.g., in or on) the display region DA through the first to third light-emitting regions PXA1, PXA2, and PXA3, which respectively display red, green, and blue colors. However, the colors of light emitted through the light-emitting regions PXA1, PXA2, and PXA3 are not particularly limited thereto.

The light control unit LCP may extend from the third light-emitting region PXA3 to be disposed at (e.g., in or on) the non-light-emitting region NXPA. In other words, the light control unit LCP may include a first portion P1 overlapping with the non-light-emitting region NPXA, and a second portion P2 overlapping with the third light-emitting region PXA3. The first portion P1 may surround (e.g., around a periphery of) the second portion P2 on a plane (e.g., in a plan view).

The first portion P1 and the second portion P2 may be formed of the same material as each other. Each of the first portion P1 and the second portion P2 may include a base resin BR3, and scatterers SP dispersed in the base resin BR3. The first portion P1 and the second portion P2 may be connected to each other to form an integrated light control unit LCP.

The scatterers SP may scatter light in various directions, which is incident from the third light-emitting element OL3 to the light control unit LCP. The scatterers SP may be particles having a relatively large density or specific gravity. For example, the scatterers SP may contain titanium oxide $(TiO_x)$, silica-based nanoparticles, or the like. The scatterers SP may improve the output efficiency of light that is provided from a light-emitting element, and passes through the light control unit LCP.

Referring to FIG. 7B, the first light conversion unit WCP1 and the second light conversion unit WCP2 may further include scatterers SP1 and SP2 dispersed in the base resins BR1 and BR2, respectively. The scatterers SP1 and SP2 included in the first light conversion unit WCP1 and the second light conversion unit WCP2 may be the same or substantially the same as the scatters SP of the light control unit LCP, and thus, redundant description thereof may not be repeated. As the scatterers SP1 and SP2 included in the first light conversion unit WCP1 and the second light conversion unit WCP2 scatter light within the light conversion units WCP1 and WCP2, the efficiency of light conversion by the quantum dots QD1 and QD2 may be improved.

FIG. 7B illustrates an embodiment in which both the first light conversion unit WCP1 and the second light conversion unit WCP2 include the scatterers SP1 and SP2, but the present disclosure is not limited thereto, and the scatterers may be included in only one of the first light conversion unit WCP1 and the second light conversion unit WCP2.

Referring to FIG. 7A, the second portion P2 adjacent to the first portion P1 may form a step difference with the first portion P1. The first portion P1 and the second portion P2 may include a first surface S1 and a second surface S2, respectively, each facing the display panel DP, and the second surface S2 of the second portion P2 may form a step difference by being recessed from the first surface S1 of the first portion P1. Accordingly, on a cross section (e.g., in a cross-sectional view), the second surface S2 of the second portion P2 may be spaced farther apart from the upper surface of the display panel DP than the first surface S1 of the first portion P1.

The light control unit LCP may have a recessed portion RP recessed from the rear surface of the light control unit LCP. An inner surface IN-S of the first portion P1 bent from the first surface S1 of the first portion P1 may be connected to the second surface S2 of the second portion P2. The inner surface IN-S of the first portion P1 and the second surface S2 of the second portion P2 that are connected to each other may form the recessed portion RP of the light control unit LCP.

On a cross section (e.g., in a cross-sectional view), the width of the first portion P1 in the second direction DR2, which is disposed between the first opening OP1 and the second opening OP2, may decrease as the first portion P1 approaches the upper substrate SUB2. Accordingly, the first portion P1 may have a reverse tapered shape on a cross section (e.g., in a cross-sectional view). However, the present disclosure is not limited thereto, and the shape of the first portion P1 may be variously modified according to a process condition.

On a cross section (e.g., in a cross-sectional view), the width of the recessed portion RP in the second direction DR2 may increase as the recessed portion RP approaches the upper substrate SUB2. Accordingly, the angle between the inner surface IN-S of the first portion P1 and the second surface S2 of the second portion P2 may be an acute angle. However, the present disclosure is not limited thereto, and the shape of the recessed portion RP may be variously modified according to a process condition.

A thickness TH1 of the second portion P2 may be smaller than a width WD of the first portion P1 adjacent to the second portion P2. The thickness TH1 of the second portion P2 may correspond to a distance in the third direction DR3 between the second surface S2 of the second portion P2 and the upper surface of the second portion P2 opposite to the second surface S2. In an embodiment of the present disclosure, the thickness TH1 of the second portion P2 may be smaller than each of a thickness TH2 of the first light conversion unit WCP1 and a thickness TH3 of the second light conversion unit WCP2.

The second portion P2 and one opening of the light control unit LCP may be arranged along the second direction DR2, and the width WD of the first portion P1 in the second direction DR2 may correspond to the width of the first surface S1. The width WD of the first portion P1 may correspond to the distance in the second direction DR2 between one end of the first portion P1 defining the one opening and the other end of the first portion P1 opposite to the one end and adjacent to the second portion P2. In other words, on a plane (e.g., in a plan view), the width WD of the first portion P1 may correspond to a separation distance between the recessed portion RP and one opening adjacent to the recessed portion RP.

For example, the third light-emitting region PXA3 and the second light-emitting region PXA2 may be disposed along the second direction DR2, and in this case, the width WD of the first portion P1 positioned between the second portion P2 and the second opening OP2 may correspond to the distance in the second direction DR2 between one end of the first portion P1 defining the second opening OP2 adjacent to the recessed portion RP and the other end of the first portion P1 defining the recessed portion RP. Similarly, the third light-emitting region PXA3 and the first light-emitting region PXA1 may be disposed along the second direction DR2, and in this case, the width of the first portion P1 positioned between the second portion P2 and the first opening OP1 may correspond to the distance in the second direction DR2 between one end of the first portion P1 defining the first opening OP1 adjacent to the recessed portion RP and the other end of the first portion P1 defining the recessed portion RP.

As the width WD of the first portion P1 has a value greater than the thickness TH1 of the second portion P2, the ratio of side light that is emitted from the third light-emitting element OL3 and passes through the first portion P1 may be smaller than the ratio of front light that is emitted from the third light-emitting element OL3 and passes through the second portion P2. In other words, it may be possible to prevent or substantially prevent color mixing between the light that is emitted from the third light-emitting element OL3 and passes through the first portion P1 and the light that is emitted from other light-emitting regions (e.g., the first and second light-emitting regions PXA1 and PXA2) except the third light-emitting region PXA3.

In an embodiment of the present disclosure, the difference between the width WD of the first portion P1 and the thickness TH1 of the second portion P2 may be about 6 micrometers ($\mu$m) or more. In this case, the ratio of side light passing through the first portion P1 to front light passing through the second portion P2 may be maintained at 1% or less. However, the present disclosure is not limited thereto, and the difference value between the width WD of the first portion P1 and the thickness TH1 of the second portion P2 may be designed differently according to the optical density of the light control unit LCP.

As the light control unit LCP includes the first portion P1 configured to prevent or substantially prevent color mixing from among the light-emitting regions PXA1, PXA2, and PXA3, and the second portion P2 configured to transmit light provided by the light-emitting element, a separate barrier rib that defines a boundary between the first to third light-emitting regions PXA1, PXA2, and PXA3 may be omitted. As the width WD of the first portion P1 overlapping with the non-light-emitting region NPXA has a greater value than the thickness TH1 of the second portion P2 overlapping with the third light-emitting region PXA3, the ratio of the side light to the front light may be reduced, and the light control unit LCP may maintain or substantially maintain the light output efficiency of the light-emitting element overlapping with the light control unit LCP, while also preventing or substantially preventing color mixing from among the light-emitting regions PXA1, PXA2, and PXA3.

An integrated light control unit LCP overlapping with the third light-emitting region PXA3 and the non-light-emitting region NPXA may be formed in the same or substantially the same photolithography process, and the formation process of the light conversion layer LCL and the display apparatus DD (e.g., refer to FIG. 1) may be simplified. In addition, by forming the light control unit LCP through a photolithography process, the density of the scatterers SP in the light control unit LCP overlapping with the third light-emitting regions PXA3 may be uniformly or substantially uniformly formed, and it may be possible to prevent or substantially prevent a defect in the display apparatus DD (e.g., refer to FIG. 1), in which a stain may be visually recognized at (e.g., in or on) the display region DA, or in which the display region DA may be yellowed due to density non-uniformity of the scatterers SP.

The core of the quantum dots QD1 and QD2 included in the first light conversion unit WCP1 and the second light conversion unit WCP2 may be selected from a group II-VI compound, a group III-VI compound, a group I-III-VI compound, a group III-V compound, a group IV-VI compound, a group IV element, a group IV compound, and/or suitable combinations thereof.

The group II-VI compound may be selected from the group consisting of: a binary compound selected from the group consisting of CdSe, CdTe, CdS, ZnS, ZnSe, ZnTe, ZnO, HgS, HgSe, HgTe, MgSe, MgS, and suitable mixtures thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and suitable mixtures thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and suitable mixtures thereof.

The group III-VI compound may include a binary compound, such as $In_2S_3$ and $In_2Se_3$, a ternary compound, such as $InGaS_3$ and $InGaSe_3$, or any suitable combinations thereof.

The group I-III-VI compound may be selected from a ternary compound selected from the group consisting of AgInS, $AgInS_2$, CuInS, $CuInS_2$, $AgGaS_2$, $CuGaS_2$ $CuGaO_2$, $AgGaO_2$, $AgAlO_2$, and suitable mixtures thereof, or a quaternary compound, such as $AgInGaS_2$ and $CuInGaS_2$.

The group III-V compound may be selected from the group consisting of: a binary compound selected from the group consisting of GaN, GaP, GaAs, GaSb, AlN, AlP, AlAs, AlSb, InN, InP, InAs, InSb, and suitable mixtures thereof; a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and suitable mixtures thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and suitable mixtures thereof. Meanwhile, the group III-V compound may further include a group II metal. For example, InZnP and/or the like may be selected as a group III-II-V compound.

The group IV-VI compound may be selected from the group consisting of a binary compound selected from the group consisting of SnS, SnSe, SnTe, PbS, PbSe, PbTe, and suitable mixtures thereof; a ternary compound selected from the group consisting of SnSeS, SnSeTe, SnSTe, PbSeS, PbSeTe, PbSTe, SnPbS, SnPbSe, SnPbTe, and suitable mixtures thereof; and a quaternary compound selected from the group consisting of SnPbSSe, SnPbSeTe, SnPbSTe, and suitable mixtures thereof. The group IV element may be selected from the group consisting of Si, Ge, and suitable mixtures thereof. The group IV compound may be a binary compound selected from the group consisting of SiC, SiGe, and suitable mixtures thereof.

In this case, the binary compound, the ternary compound, or the quaternary compound may be present in a particle at a uniform or substantially uniform concentration, or may be present in the same particle by being divided into states in which the concentration distributions thereof are partially different from one another.

The quantum dots QD1 and QD2 may have a core-shell structure including a core, and a shell surrounding (e.g., around a periphery of) the core. In addition, in an embodiment of the present disclosure, the quantum dots QD1 and QD2 may have a core/shell structure in which one quantum dot surrounds (e.g., around a periphery of) another quantum dot. The interface between the core and the shell may have a concentration gradient in which the concentration of an element present in the shell gradually decreases toward the center.

In an embodiment of the present disclosure, the quantum dots QD1 and QD2 may have the aforementioned core-shell structure including nanocrystals. The shell of the quantum dot may serve as a protective layer configured to prevent or substantially prevent chemical degeneration of the core, so that semiconductor properties are maintained or substantially maintained, and/or as a charging layer configured to impart electrophoretic properties to the quantum dot. The shell may be a single-layer or multi-layered. The interface between the core and the shell may have a concentration gradient in which the concentration of an element present in the shell gradually decreases toward the center. Examples of the shell of the quantum dot may include a metal oxide, a non-metal oxide, a semiconductor compound, or suitable combinations thereof.

For example, the metal oxide or the non-metal oxide may include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, or a ternary compound, such as $MgAl_2O_4$, $CoFe_2O_4$, $NiFe_2O_4$, and/or $CoMn_2O_4$, but the material thereof is not limited to the above examples.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like, but the material thereof is not limited to the above examples.

The quantum dots QD1 and QD2 may have a full width of half maximum (FWHM) of a light-emitting wavelength spectrum of about 45 nm or less, such as about 40 nm or less, or about 30 nm or less, and in those ranges, color purity or color reproducibility may be improved. In addition, because light emitted through the quantum dots QD1 and QD2 is emitted in all directions, a wide viewing angle may be improved.

The shapes of the quantum dots QD1 and QD2 are not particularly limited to those generally used in the art, but as examples, any suitable shapes may be used, such as spherical, pyramidal, multi-arm-shaped, cubic nanoparticles, nanotubes, nanowires, nanofibers, or nanoplate-shaped particles.

The quantum dots QD1 and QD2 may control the color of light emitted according to a particle size, and accordingly, the quantum dots QD1 and QD2 may have various suitable light-emitting colors, such as blue, red, and green. When the aforementioned light-emitting layers EML1, EML2, and EML3 include a quantum dot material, the quantum dots QD1 and QD2 described above may be applied to the quantum dot material included in the light-emitting layers EML1, EML2, and EML3.

The low refractive index layer LR may be disposed between the light conversion layer LCL and the color filter layer CFL. The low refractive index layer LR may have a refractive index smaller than the refractive index of each of the first and second light conversion units WCP1 and WCP2 and the light control unit LCP. For example, the refractive index of the low refractive index layer LR may be about 1.1 to about 1.5, and in more detail, may be about 1.1 to about 1.35. However, the refractive index of the low refractive index layer LR is not limited to the above numerical examples. The low refractive index layer LR may include a low refractive index organic film having a relatively low refractive index. The low refractive index layer LR may further include hollow particles and/or voids dispersed in the organic film, and the refractive index of the low refractive index layer LR may be adjusted by a ratio of the hollow particles and/or voids.

The low refractive index layer LR disposed on the light conversion layer LCL may transmit light, which is not converted by the light conversion units WCP1 and WCP2 and is emitted from the upper surfaces of the light conversion units WCP1 and WCP2, back toward the insides of the light conversion units WCP1 and WCP2 by using a refractive index. The light transmitted back toward the insides of the light conversion units WCP1 and WCP2 by the low refractive index layer LR may be converted by the quantum dots QD1 and QD2. In other words, the low refractive index layer LR may improve the light output efficiency of the display apparatus DD (e.g., refer to FIG. 1) through recycling of light, which occurs due to a difference in the refractive index.

The low refractive index layer LR may contain a material having a high light transmittance. For example, the low refractive index layer LR may have a high transmittance of 90% or more. As the low refractive index layer LR has a high transmittance, the transmittance of light emitted toward the front surface of the display module DM may not be reduced.

The first capping layer CP1 may be disposed on the rear surface of the low refractive index layer LR facing the display panel DP. The first capping layer CP1 may contain an inorganic material. The first capping layer CP1 may prevent or substantially prevent moisture and/or gas from entering into the low refractive index layer LR.

The second capping layer CP2 may be disposed on the rear surface of the light conversion layer LCL facing the display panel DP. The second capping layer CP2 may contain an inorganic material. The second capping layer CP2 may prevent or substantially prevent moisture and/or foreign substances from entering into the light conversion layer LCL. The first capping layer CP1 and the second capping layer CP2 may cover the upper and lower portions, respectively, of the light conversion layer LCL to protect the light conversion layer LCL, and to prevent or substantially prevent deterioration due to moisture.

A stacking order of the components of the light control member LCM is not limited to that illustrated in FIG. 7A. For example, the low refractive index layer LR of the light control member LCM may be disposed on the rear surface of the light conversion layer LCL. As another example, the light control member LCM may include a plurality of low refractive layers. In this case, one of the plurality of low refractive layers may be disposed between the color filter layer CFL and the light conversion layer LCL, and another one of the plurality of low refractive layers may be disposed on the rear surface of the light conversion layer LCL.

The color filter layer CFL may include a first color filter CF1, a second color filter CF2, and a third color filter CF3. The first to third color filters CF1, CF2, and CF3 may be disposed to correspond to the first to third light-emitting regions PXA1, PXA2, and PXA3, respectively, on a plane (e.g., in a plan view). For example, the first color filter CF1 may overlap with the first light-emitting region PXA1, the second color filter CF2 may overlap with the second light-emitting region PXA2, and the third color filter CF3 may overlap with the third light-emitting region PXA3.

Each of the first to third color filters CF1, CF2, and CF3 may contain a base resin, and a pigment or dye dispersed in the base resin. Each of the first to third color filters CF1, CF2, and CF3 may transmit light having a suitable wavelength range (e.g., a specific wavelength range), and may absorb most of the light having a wavelength range outside of the suitable wavelength range.

For example, one of the first to third color filters CF1, CF2, and CF3 may include a red color filter, another thereof may include a green color filter, and the other thereof may include a blue color filter. The red color filter may transmit red light, and may absorb most of green light and blue light. The green color filter may transmit green light, and may absorb most of red light and blue light. The blue color filter may transmit blue light, and may absorb most of red light and green light. However, the colors transmitted by the color filters CF1, CF2, and CF3 are not limited to the above examples.

The first color filter CF1 may be disposed on the first light conversion unit WCP1. The first color filter CF1 may transmit a second light provided from the first light conversion unit WCP1. For example, the first light conversion unit WCP1 may convert the first light provided from the first light-emitting element OL1 into red light, and the first color filter CF1 may transmit the red light provided from the first light conversion unit WCP1. The first color filter CF1 may absorb green light and blue light incident toward the first color filter CF1. The first color filter CF1 may absorb light that is not converted by the first light conversion unit WCP1 from among the light incident toward the first color filter CF1, so as to prevent or substantially prevent color purity in the first light-emitting region PXA1 from being deteriorated.

The second color filter CF2 may be disposed on the second light conversion unit WCP2 to transmit a third light provided from the second light conversion unit WCP2. For example, the second light conversion unit WCP2 may convert the first light provided from the second light-emitting element OL2 into green light, and the second color filter CF2 may transmit the green light provided from the second light conversion unit WCP2. The second color filter CF2 may absorb red light and blue light incident toward the second color filter CF2. The second color filter CF2 may absorb light that is not converted by the second light conversion unit WCP2 from among the light incident toward the second color filter CF2, so as to prevent or substantially prevent color purity in the second light-emitting region PXA2 from being deteriorated.

The third color filter CF3 may be disposed on the light control unit LCP. The third color filter CF3 may overlap with the second portion P2 of the light control unit LCP. The third color filter CF3 may transmit the first light provided from the third light-emitting element OL3 and passing through the light control unit LCP. For example, the third color filter CF3 may transmit blue light, and may absorb green light and red light, so as to prevent or substantially prevent color purity in the third light-emitting region PXA3 from being deteriorated.

External light, such as natural light, may be incident from the outside of the display module DM toward the display module DM. The external light may include red light, green light, and blue light. When the display module DM does not include the color filter layer CFL, the external light incident toward the display module DM may be reflected by conductive patterns (e.g., signal lines, electrodes, and the like) inside the display module DM, and may be provided to a user, such that the user may visually recognize the reflected light.

The first to third color filters CF1, CF2, and CF3 may prevent or substantially prevent reflection of the external light. For example, the first color filter CF1 may be a red color filter that may absorb light corresponding to green light and blue light from among the external light, and may filter the external light into red light. Similarly, the second color filter CF2 may be a green color filter that may absorb light corresponding to red light and blue light from among the external light, and may filter the external light into green light. The third color filter CF3 may be a blue color filter that may absorb light corresponding to red light and green light from among the external light, and may filter the external light into blue light.

At least two color filters from among the first to third color filters CF1, CF2, and CF3 may overlap with each other at (e.g., in or on) the non-light-emitting region NPXA. For example, the first to third color filters CF1, CF2, and CF3 may be disposed to overlap with each other at (e.g., in or on) the non-light-emitting region NPXA along the third direction DR3. The first to third color filters CF1, CF2, and CF3 disposed to overlap with each other may overlap with the first portion P1 of the light control unit LCP. The first to third color filters CF1, CF2, and CF3 disposed to overlap with each other may block light passing through the non-light-emitting region NPXA, so as to prevent or substantially prevent color mixing from among the first to third light-emitting regions PXA1, PXA2, and PXA3.

Figure 8:
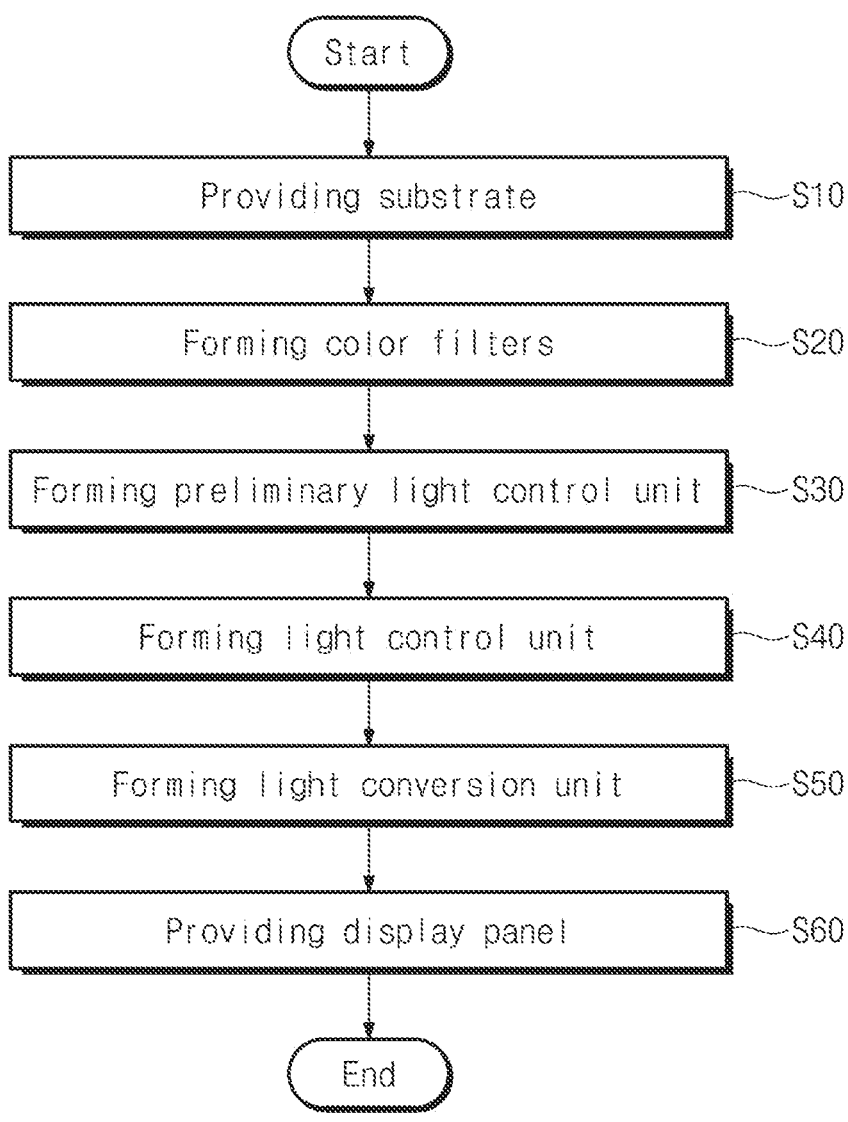
FIG. 8 is a flowchart of a method of manufacturing a display apparatus according to an embodiment of the present disclosure.

FIG. 8 is a flowchart of a method of manufacturing a display apparatus according to an embodiment of the present disclosure. FIGS. 9A through 9F are cross-sectional views illustrating various processes of the method of manufacturing the display apparatus according to an embodiment of the present disclosure.

Referring to FIG. 8, the method of manufacturing the display apparatus according to an embodiment of the present disclosure may include providing a substrate (S10), forming color filters (S20), forming a preliminary light control unit (S30), forming a light control unit (S40), forming a light conversion unit (S50), and providing a display panel (S60).

The substrate provided in the providing of the substrate (S10) may correspond to the upper substrate SUB2 (e.g., refer to FIG. 7A) described above. In the forming of the color filters (S20), a plurality of color filters may be sequentially formed on one surface of the upper substrate SUB2 through a photolithography process. In the forming of the preliminary light control unit (S30), the preliminary light control unit may be formed by applying a base resin, in which scatterers are dispersed, on the substrate on which the color filters are disposed. The light control unit having an opening and a recessed portion may be formed by patterning the preliminary light control unit (S40). In the forming of the light conversion unit (S50), the light conversion unit may be formed by applying a base resin, in which quantum dots are dispersed, in the opening of the light control unit. The display panel including a plurality of light-emitting elements may be provided on the substrate on which the light control unit and the light conversion unit are formed (S60). Here, the display panel may correspond to the display panel DP (e.g., refer to FIG. 7A) described above. A display apparatus may be formed by bonding the substrate, on which the color filter and the light control unit are formed, and the display panel to each other. Hereinafter, various processes of the method of manufacturing the display apparatus will be described in more detail with reference to FIGS. 9A through 9F.

For convenience of illustration, FIGS. 9A to 9F illustrate the first to third light-emitting regions PXA1, PXA2, and PXA3 corresponding to the light-emitting elements OL1, OL2, and OL3 (e.g., refer to FIG. 7A) of the display panel DP to be provided on the substrate SUB2 in a subsequent process, and the non-light-emitting region NPXA surrounding (e.g., around peripheries of) the first to third light-emitting regions PXA1, PXA2, and PXA3.

Figure 9A:
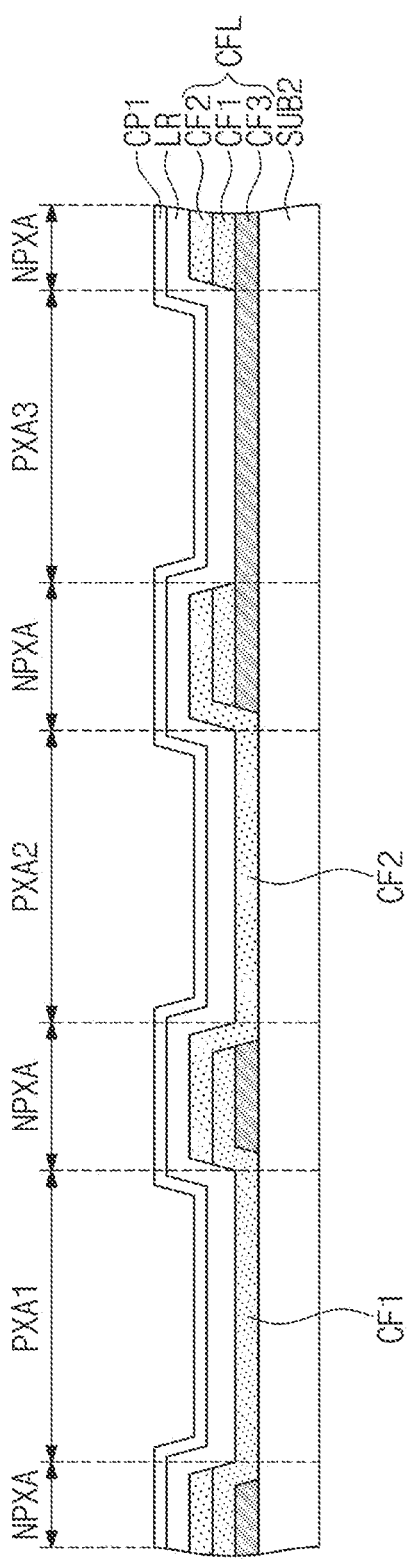
FIGS. 9A-9F are cross-sectional views illustrating various processes of the method of manufacturing the display apparatus according to an embodiment of the present disclosure.

FIG. 9A illustrates a cross section of the substrate after the forming of the color filters (S20) (e.g., refer to FIG. 8). Referring to FIG. 9A, the first to third color filters CF1, CF2, and CF3 may be formed on one surface of the substrate SUB2 provided in the providing of the substrate (S10) (e.g., refer to FIG. 8). The first to third color filters CF1, CF2, and CF3 may be the same or substantially the same as (or similar to) those described above, and thus, redundant description thereof may not be repeated.

Each of the first to third color filters CF1, CF2, and CF3 may be formed by patterning with the use of photolithography after forming a filter layer on the entire region of the one surface of the substrate SUB2. However, the process of forming the first to third color filters CF1, CF2, and CF3 is not limited thereto.

As shown in FIG. 9A, the third color filter CF3 may be formed on the one surface of the substrate SUB2, so as to overlap with the third light-emitting region PXA3. A portion of the third color filter CF3 may overlap with the non-light-emitting region NPXA. The third color filter CF3 may not overlap with the first and second light-emitting regions PXA1 and PXA2.

The first color filter CF1 may be formed on the substrate SUB2 on which the third color filter CF3 is formed. The first color filter CF1 may overlap with the first light-emitting region PXA1, and may not overlap with the second and third light-emitting regions PXA2 and PXA3. The first color filter CF1 may be disposed on the one surface of the substrate SUB2 at (e.g., in or on) the first light-emitting region PXA1. A portion of the first color filter CF1 may overlap with the non-light-emitting region NPXA, and may be disposed on the third color filter CF3 at (e.g., in or on) the non-light-emitting region NPXA.

The second color filter CF2 may be formed on the substrate SUB2 on which the first and third color filters CF1 and CF3 are formed. The second color filter CF2 may overlap with the second light-emitting region PXA2, and may not overlap with the first and third light-emitting regions PXA1 and PXA3. The second color filter CF2 may be disposed on the one surface of the substrate SUB2 at (e.g., in or on) the second light-emitting region PXA2. A portion of the second color filter CF2 may overlap with the non-light-emitting region NXPA, and may be disposed on the first color filter CF1 at (e.g., in or on) the non-light-emitting region NPXA.

The first to third color filters CF1, CF2, and CF3 disposed on the substrate SUB2 may be defined as the color filter layer CFL. However, the formation order of the first to third color filters CF1, CF2, and CF3 is not limited to that illustrated in FIG. 9A.

The low refractive index layer LR may be formed on the substrate SUB2 on which the color filter layer CFL is formed. The low refractive index layer LR may be formed by coating, depositing, or printing a composition constituting the low refractive index layer LR on the color filter layer CFL. The low refractive index layer LR may cover one surface of the color filter layer CFL. The low refractive index layer LR may be provided as an integral layer overlapping with the first to third light-emitting regions PXA1, PXA2, and PXA3.

The first capping layer CP1 may be formed on the low refractive index layer LR to cover the low refractive index layer LR. In an embodiment of the present disclosure, the first capping layer CP1 may be formed by depositing an inorganic material, but the present disclosure is not limited thereto. The first capping layer CP1 may provide a base surface on which the light control unit LCP and the light conversion units WCP1 and WCP2 (e.g., refer to FIG. 9F) are formed in a subsequent process, and may protect the low refractive index layer LR during the subsequent process.

Figure 9B:
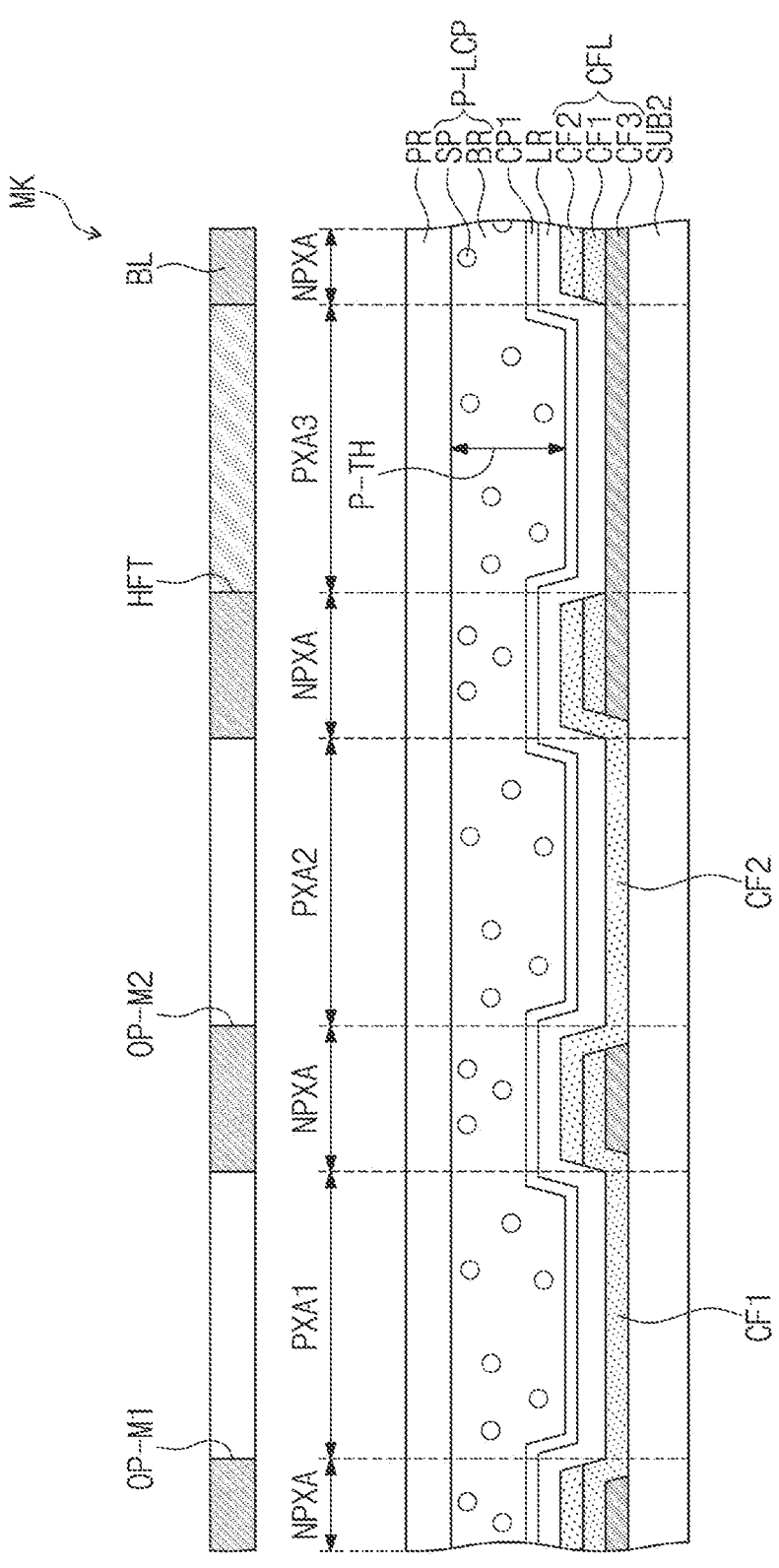

FIG. 9B illustrates a cross section of the substrate after the forming of the preliminary light control unit (S30) (e.g., refer to FIG. 8). A process of the method of manufacturing the display apparatus illustrated in FIG. 9B may correspond to the forming of the light control unit LCP (e.g., refer to FIG. 9C) from the preliminary light control unit P-LCP. A process of the method of manufacturing the display apparatus illustrated in FIG. 9C may correspond to the forming of the light control unit LCP having the openings OP1 and OP2 and the recessed portion RP from the preliminary light control unit P-LCP (S40) (e.g., refer to FIG. 8).

Referring to FIG. 9B, the preliminary light control unit P-LCP may be formed on the substrate SUB2 on which the color filter layer CFL and the low refractive index layer LR are disposed. The preliminary light control unit P-LCP may be disposed to overlap with the first to third light-emitting regions PXA1, PXA2, and PXA3 and the non-light-emitting region NPXA. The preliminary light control unit P-LCP may be formed by applying a base resin BR, in which scatterers SP are dispersed, on the first capping layer CP1 by coating, depositing, printing, or the like. In this case, the scatterers SP may be widely dispersed at a uniform or substantially uniform density in the base resin BR without being concentrated in a specific region.

In order to pattern the preliminary light control unit P-LCP, a photoresist layer PR may be formed on the preliminary light control unit P-LCP. The photoresist layer PR may include a photosensitive material having properties that are changed by light. A mask MK including mask openings OP-M1 and OP-M2, a light blocking portion BL, and a semi-transmissive portion HFT may be provided on the photoresist layer PR. One mask opening OP-M1 from among the mask openings OP-M1 and OP-M2 may overlap with the first light-emitting region PXA1, and another mask opening OP-M2 may overlap with the second light-emitting region PXA2. The semi-transmissive portion HFT of the mask MK may overlap with the third light-emitting region PXA3, and the light blocking portion BL of the mask MK may overlap with the non-light-emitting region NPXA.

After providing the mask MK, an exposure process may be performed, in which light is irradiated onto the mask MK. Light that passes through the mask openings OP-M1 and OP-M2 may be irradiated onto portions of the photoresist layer PR overlapping with the mask openings OP-M1 and OP-M2, so as to change the physical properties of the portions of the photoresist layer PR.

Figure 9C:
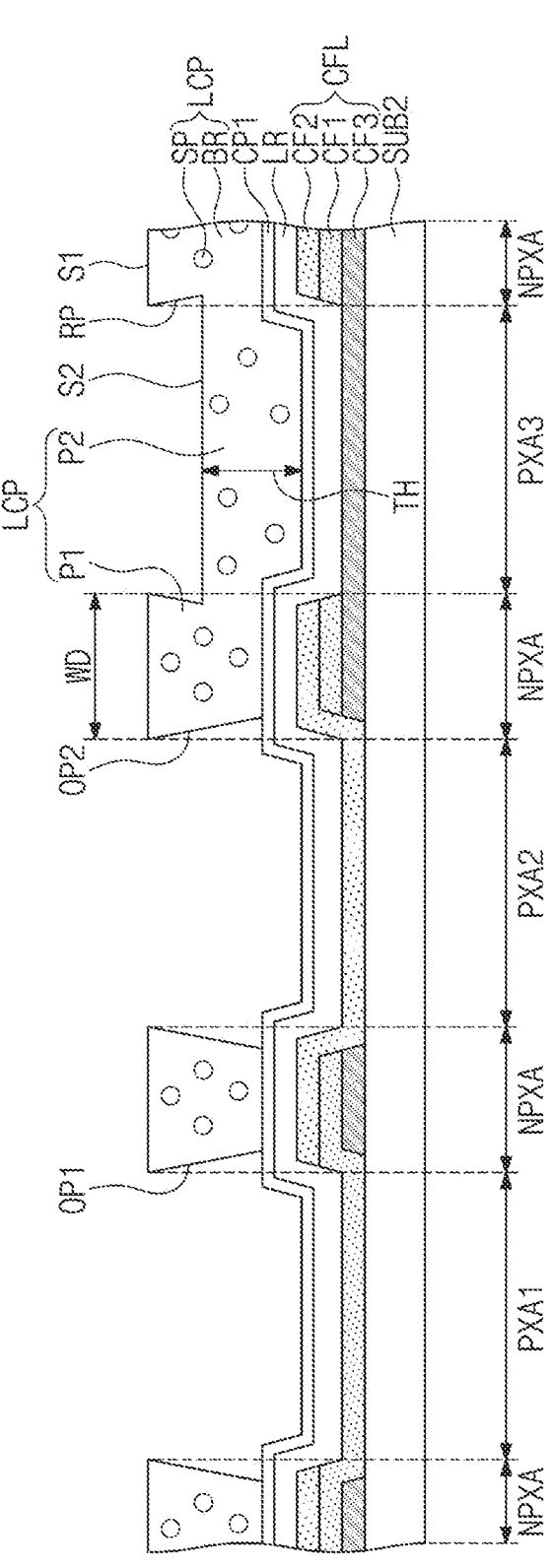

Referring to FIGS. 9B and 9C, the portions of the photoresist layer PR overlapping with the mask openings OP-M1 and OP-M2 may be removed by a developer provided in a development process, and portions of the preliminary light control unit P-LCP overlapping with the mask openings OP-M1 and OP-M2 may be exposed. The exposed portions of the preliminary light control unit P-LCP may be etched through an etching process, and first and second openings OP1 and OP2 illustrated in FIG. 9C may be formed. The first opening OP1 may overlap with the first light-emitting region PXA1, and the second opening OP2 may overlap with the second light-emitting region PXA2. The first and second openings OP1 and OP2 may be formed to pass through the light control unit LCP, and accordingly, the light control unit LCP may not overlap with the first and second light-emitting regions PXA1 and PXA2.

On a cross section (e.g., in a cross-sectional view), the width of each of the first and second openings OP1 and OP2 may increase as they approach the substrate SUB2. Accordingly, on a cross section (e.g., in a cross-sectional view), the width of the first portion P1 disposed between the first opening OP1 and the second opening OP2 may decrease as the first portion P1 approaches the upper substrate SUB2. The first portion P1 may have a trapezoidal shape on a cross section (e.g., in a cross-sectional view). However, the shape of the first portion P1 is not limited thereto.

The light blocking portion BL of the mask MK may block light provided on the mask MK, and the light may not be irradiated onto a portion of the photoresist layer PR overlapping with the light blocking portion BL. Accordingly, even after a development process, the portion of the photoresist layer PR overlapping with the light blocking portion BL may remain on the preliminary light control unit P-LCP. A portion of the preliminary light control unit P-LCP overlapping with the light blocking portion BL may be formed as the first portion P1 of the light control unit LCP after a photolithography process. The first portion P1 of the light control unit LCP may overlap with the non-light-emitting region NPXA.

An amount of light passing through the semi-transmissive portion HFT of the mask MK may be greater than an amount of light passing through the blocking portion BL, and may be smaller than an amount of light passing through the mask openings OP-M1 and OP-M2. Because the mask MK includes the light blocking portion BL and the semi-transmissive portion HFT, light may be differentially irradiated according to the region of the photoresist layer PR, and then, the light control unit LCP partially having different thicknesses may be formed through a development and etching process.

A portion of the preliminary light control unit P-LCP overlapping with the semi-transmissive portion HFT of the mask MK may be etched in the thickness direction, and a recessed portion RP overlapping with the third light-emitting region PXA3 and provided by being recessed from one surface of the preliminary light control unit P-LCP may be formed. In other words, by using the semi-transmissive portion HFT of the mask MK, the second portion P2 having a thickness TH smaller than the thickness P-TH (e.g., refer to FIG. 9B) of the preliminary light control unit P-LCP overlapping with the third light-emitting region PXA3 may be formed. Thus, a step difference may be formed between a first surface S1 of the first portion P1 and a second surface S2 of the second portion P2. The first portion P1 and the second portion P2 may be the same or substantially the same as (or similar to) those described above, and thus, redundant description thereof may not be repeated.

The width of the recessed portion RP on a cross section (e.g., in a cross-sectional view) may increase as the recessed portion RP approaches the upper substrate SUB2. However, the present disclosure is not limited thereto, and the shape of the recessed portion RP may be variously modified according to a process condition.

The thickness TH of the second portion P2 may be adjusted by controlling the formation conditions of the second portion P2, such as the amount of light passing through the semi-transmissive portion HFT, and an etching condition. The method of manufacturing the display apparatus according to one or more embodiments of the present disclosure may form the second portion P2, so that the thickness TH of the second portion P2 is smaller than the width WD of the first portion P1. Because the thickness TH of the second portion P2 is smaller than the width WD of the first portion P1, color mixing at (e.g., in or on) the non-light-emitting region NPXA may be prevented or substantially prevented, and the light control unit LCP having improved light output efficiency at (e.g., in or on) the third light-emitting region PXA3 may be provided.

Although the method of manufacturing the display apparatus has been described above based on a positive photo process in which etching is performed to correspond to the mask opening of the mask MK, the present disclosure is not limited thereto, and the light control unit LCP may be formed through a negative photo process in which a pattern is formed in a portion corresponding to the mask opening of the mask MK.

The first portion P1 and the second portion P2 may be concurrently (e.g., simultaneously) formed from the preliminary light control unit P-LCP through a photolithography process using one mask MK. The first portion P1 overlapping with the non-light-emitting region NPXA and the second portion P2 overlapping with the third light-emitting region PXA3 may be integrally formed. In addition, the light control unit LCP including the first portion P1 and the second portion P2, which forms a step difference with the first portion P1, may be formed by using one mask MK. Accordingly, the light control unit LCP having both the functions of a barrier rib and a light-transmissive portion may be formed without an additional mask or an additional process of forming a separate barrier rib. Therefore, the manufacturing process of the display apparatus may be simplified.

When a light control unit is formed in each of the regions corresponding to the third light-emitting regions PXA3 by using an inkjet method, scatterers SP may settle before application on the substrate SUB2 due to an inkjet ejection waiting time. As a result, the density of the scatterers SP may vary depending on a region in which the light control unit LCP is formed. The density non-uniformity of the scatterers SP may cause the luminance of the third light-emitting region PXA3 overlapping with the light control unit to not be uniform or substantially uniform. Because of this, a stain may occur that may be visually recognized in a display region of a display apparatus, and the reliability of the display apparatus may be deteriorated.

However, the light control unit LCP manufactured through the method of manufacturing the display apparatus according to one or more embodiments of the present disclosure may be formed so that the scatterers SP have a uniform or substantially uniform density in portions overlapping with the third light-emitting regions PXA3. Accordingly, luminance non-uniformity and/or visual recognition of a stain, which may be caused by the density non-uniformity of the scatterers SP, may be prevented or substantially prevented, and thus, the reliability of the display apparatus may be improved.

Figure 9D:
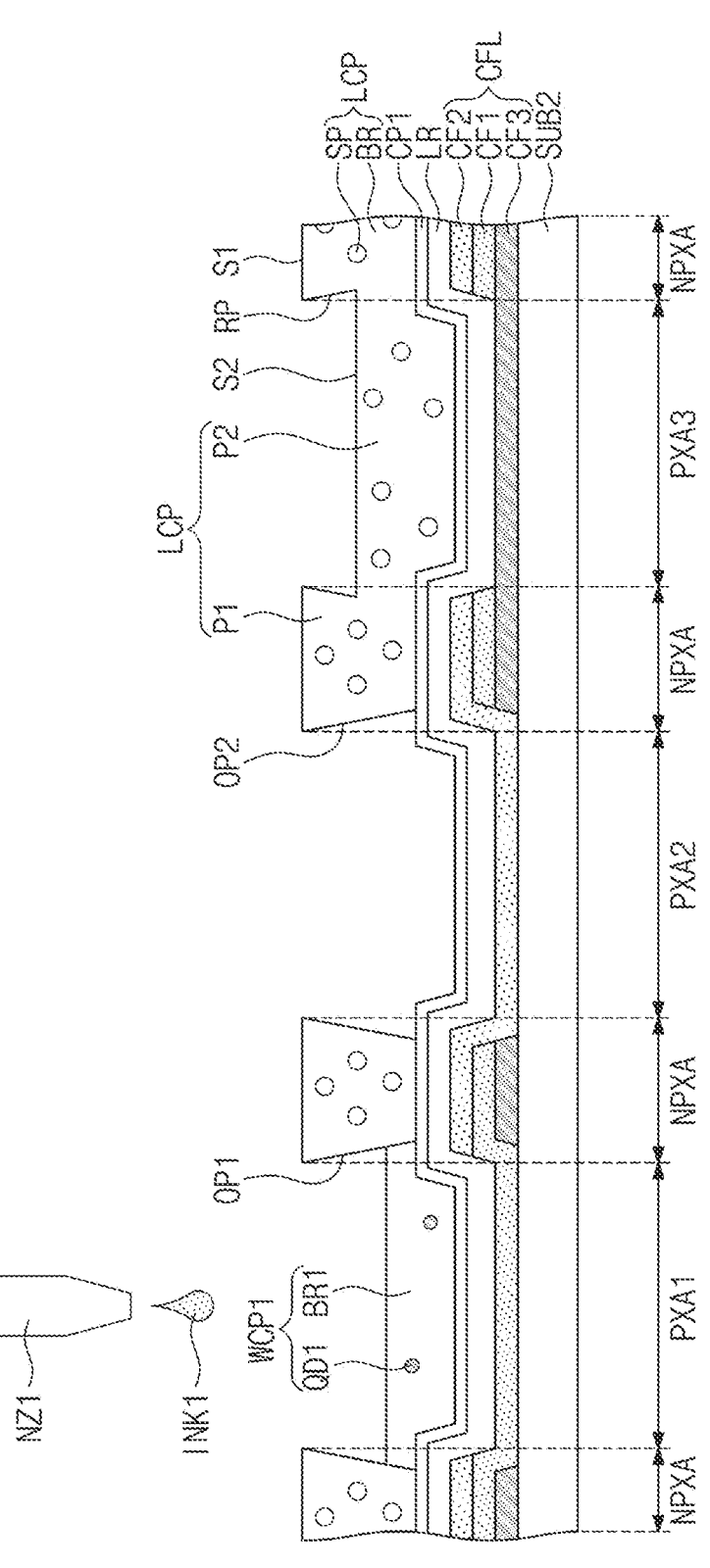
Figure 9E:
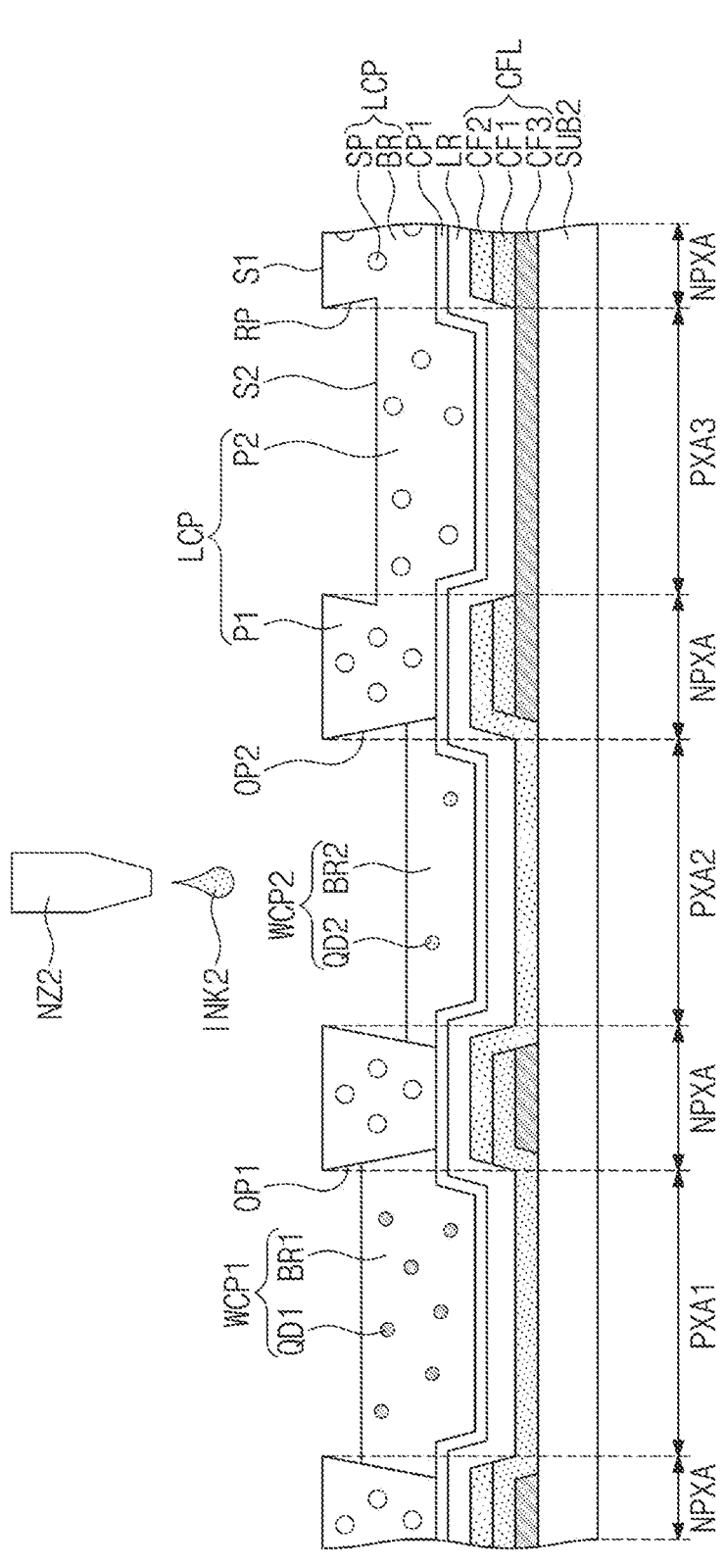

FIGS. 9D and 9E illustrate processes of forming the first and second light conversion units WCP1 and WCP2 (S50) (e.g., refer to FIG. 8).

Referring to FIG. 9D, a first nozzle NZ1 may be provided on the first opening OP1 overlapping with the first light-emitting region PXA1. The first nozzle NZ1 may eject a first ink INK1 into the first opening OP1. The first ink INK1 may include a composition constituting the first light conversion unit WCP1. For example, the first ink INK1 may include a base resin BR1, in which the first quantum dots QD1 are dispersed. However, the present disclosure is not limited thereto, and the first ink INK1 may further include the scatterers dispersed in the base resin BR1.

Referring to FIG. 9E, a second nozzle NZ2 may be provided on the second opening OP2 overlapping with the second light-emitting region PXA2. The second nozzle NZ2 may eject a second ink INK2 into the second opening OP2. The second ink INK2 may include a composition constituting the second light conversion unit WCP2. For example, the second ink INK2 may include a base resin BR2, in which the second quantum dots QD2 are dispersed. However, the present disclosure is not limited thereto, and the second ink INK2 may further include the scatterers dispersed in the base resin BR2.

Figure 9F:
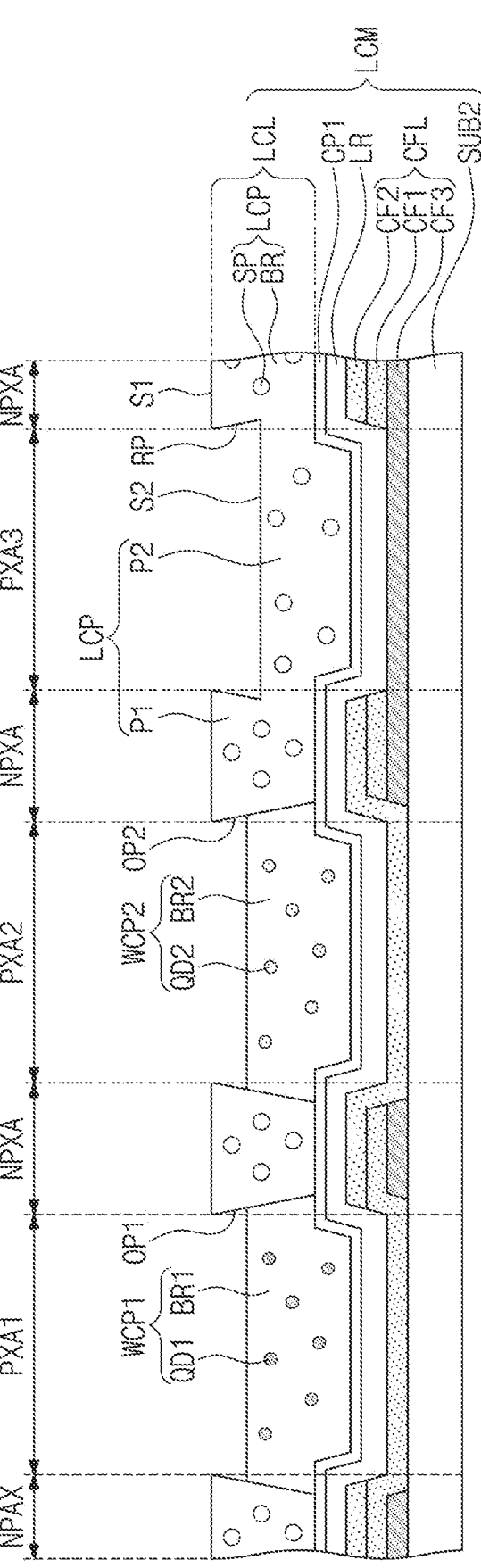

FIG. 9F illustrates a cross section of the substrate on which the light control unit LCP and the light conversion units WCP1 and WCP2 are formed. Referring to FIG. 9F, the light control unit LCP, and the first and second light conversion units WCP1 and WCP2 disposed in the first and second openings OP1 and OP2, respectively, may be defined as the light conversion layer LCL, which has been described above. The method of manufacturing the display apparatus according to an embodiment of the present disclosure may further include forming the second capping layer CP2 (e.g., refer to FIG. 7A) on the light conversion layer LCL.

The substrate SUB2 on which the color filter layer CFL and the light conversion layer LCL are disposed may correspond to the light control member LCM. The display panel DP (e.g., refer to FIG. 7A) may be provided on the light control member LCM, so that the light conversion layer LCL and the display panel DP face each other. The display panel DP (e.g., refer to FIG. 7A) may be arranged on the light control member LCM, so that the first color filter CF1 and the first light conversion unit WCP1 overlap with the first light-emitting element OL1, the second color filter CF2 and the second light conversion unit WCP2 overlap with the second light-emitting element OL2, and the third color filter CF3 and the light control unit LCP overlap with the third light-emitting element OL3. The display apparatus according to one or more embodiments of the present disclosure may be manufactured by bonding the light control member LCM and the display panel DP (e.g., refer to FIG. 7A) to each other.

By including the light control unit having a thickness in a portion overlapping with the light-emitting region that is smaller in value than a width in a portion overlapping with the non-light-emitting region, the display apparatus according to one or more embodiments of the present disclosure may prevent or substantially prevent color mixing at (e.g., in or on) the non-light-emitting region, and may provide the light control unit having improved light output efficiency at (e.g., in or on) the light-emitting region as well. Because scatterers are provided to have a uniform or substantially uniform density in portions of the light control unit overlapping with the light-emitting regions, luminance non-uniformity between the light-emitting regions, which may be caused by the density non-uniformity of the scatterers, may be prevented or substantially prevented. Accordingly, a stain that may be visually recognized in the display region of the display apparatus may be prevented or substantially prevented, or the display region may be prevented or substantially prevented from being yellowed, and thus, the reliability of the display apparatus may be improved.

By using one mask, the method of manufacturing the display apparatus according to one or more embodiments of the present disclosure may form the light control unit having a thickness in a portion overlapping with the light-emitting region that is smaller in value than a width in a portion overlapping with the non-light-emitting region. Accordingly, a process of forming a separate barrier rib may be omitted, and the light control unit having a uniform or substantially uniform density of scatterers may be formed. The method of manufacturing the display apparatus according to one or more embodiments of the present disclosure may provide a display apparatus with improved reliability through a simplified process.

The light control unit according to one or more embodiments of the present disclosure may be formed as an integrated light control unit overlapping with the light-emitting region and the non-light-emitting region through the same photolithography process, and thus, the density of the scatterers dispersed in the light control unit may be uniformly or substantially uniformly formed.

Because the light control unit according to one or more embodiments of the present disclosure is formed so that the thickness of the light control unit overlapping with the light-emitting region is smaller than the width of the light control unit overlapping with the non-light-emitting region, color mixing at (e.g., in or on) the non-light-emitting region may be prevented or substantially prevented, while the light control unit having a uniform or substantially uniform density of the scatterers may be provided.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display apparatus comprising:
a display element layer having first to third light-emitting regions, and a non-light-emitting region surrounding the first to third light-emitting regions, the display element layer comprising a plurality of light-emitting elements located along one direction and corresponding to the first to third light-emitting regions, respectively, each of the light-emitting elements configured to provide source light;
a light control unit on the display element layer, the light control unit comprising a base resin and scatters, and having openings overlapping with the first and second light-emitting regions, respectively;
light conversion units in the openings, respectively, and comprising quantum dots; and
first to third color filters on the light control unit and the light conversion units, and overlapping with the first to third light-emitting regions, respectively,
wherein:
the light control unit comprises a first portion overlapping with the non-light-emitting region, and a second portion overlapping with the third light-emitting region, the first portion and the second portion comprising the same material as each other, and forming a step difference with each other;
a width of the first portion in the one direction is greater than a thickness of the second portion in a thickness direction crossing the one direction;
the first portion and the second portion include a first surface and a second surface, respectively, each of the first surface and the second surface facing the display element layer; and
the second surface of the second portion is spaced farther from the display element layer than the first surface of the first portion in the thickness direction.

2. The display apparatus of claim 1, wherein, in a plan view, the width of the first portion corresponds to a distance between one end of the first portion defining an opening adjacent to the second portion and another end of the first portion forming the step difference.

3. A display apparatus comprising:
a display element layer having first to third light-emitting regions, and a non-light-emitting region surrounding the first to third light-emitting regions, the display element layer comprising a plurality of light-emitting elements located along one direction and corresponding to the first to third light-emitting regions, respectively, each of the light-emitting elements configured to provide source light;
a light control unit on the display element layer, the light control unit comprising a base resin and scatters, and having openings overlapping with the first and second light-emitting regions, respectively;
light conversion units in the openings, respectively, and comprising quantum dots; and
first to third color filters on the light control unit and the light conversion units, and overlapping with the first to third light-emitting regions, respectively,
wherein:
the light control unit comprises a first portion overlapping with the non-light-emitting region, and a second portion overlapping with the third light-emitting region, the first portion and the second portion comprising the same material as each other, and forming a step difference with each other;

a width of the first portion in the one direction is greater than a thickness of the second portion in a thickness direction crossing the one direction; and the thickness of the second portion is smaller than a thickness of each of the light conversion units.

4. The display apparatus of claim 1, wherein a difference between the width of the first portion and the thickness of the second portion is about 6 micrometers or more.

5. The display apparatus of claim 1, wherein the first portion surrounds the second portion in a plan view.

6. The display apparatus of claim 1, wherein the light control unit surrounds the light conversion units in a plan view.

7. The display apparatus of claim 1, wherein at least two color filters from among the first to third color filters overlap with each other at the non-light-emitting region.

8. The display apparatus of claim 1, wherein the first to third color filters have different colors from each other.

9. An electronic apparatus comprising:

a display apparatus comprising:

a display element layer having first to third light-emitting regions, and a non-light-emitting region surrounding the first to third light-emitting regions, the display element layer comprising a plurality of light-emitting elements located along one direction and corresponding to the first to third light-emitting regions, respectively, each of the light-emitting elements configured to provide source light;

a light control unit on the display element layer, the light control unit comprising a base resin and scatters, and having openings overlapping with the first and second light-emitting regions, respectively:

light conversion units in the openings, respectively, and comprising quantum dots; and first to third color filters on the light control unit and the light conversion units, and overlapping with the first to third light-emitting regions, respectively, wherein:

the light control unit comprises a first portion overlapping with the non-light-emitting region, and a second portion overlapping with the third light-emitting region, the first portion and the second portion comprising the same material as each other, and forming a step difference with each other;

a width of the first portion in the one direction is greater than a thickness of the second portion in a thickness direction crossing the one direction;

the first to third color filters have different colors from each other;

the light conversion units comprise:

a first light conversion unit overlapping with the first light-emitting region, and comprising a first quantum dot configured to convert the source light into a first light; and a second light conversion unit overlapping with the second light-emitting region, and comprising a second quantum dot configured to convert the source light into a second light different from the first light;

the first light conversion unit overlaps with the first color filter;

the second light conversion unit overlaps with the second color filter; and the light control unit overlaps with the third color filter.

10. The electronic apparatus of claim 9, wherein at least one of the first light conversion unit or the second light conversion unit further comprises scatterers.

11. The display apparatus of claim 1, further comprising a low refractive index layer between the first to third color filters and the light control unit, and covering the first to third color filters.

* * * * *